(12) United States Patent
McCann

(10) Patent No.: US 8,216,871 B2
(45) Date of Patent: Jul. 10, 2012

(54) METHOD FOR THIN FILM THERMOELECTRIC MODULE FABRICATION

(75) Inventor: Patrick John McCann, Norman, OK (US)

(73) Assignee: The Board of Regents of the University of Oklahoma, Norman, OK (US)

( * ) Notice: Subject to any disclaimer, the term of this patent is extended or adjusted under 35 U.S.C. 154(b) by 25 days.

(21) Appl. No.: 12/898,218

(22) Filed: Oct. 5, 2010

(65) Prior Publication Data

US 2011/0241153 A1    Oct. 6, 2011

Related U.S. Application Data

(60) Provisional application No. 61/248,691, filed on Oct. 5, 2009.

(51) Int. Cl.
*H01L 21/00* (2006.01)
(52) U.S. Cl. .................. 438/54; 257/E21.087
(58) Field of Classification Search ........... 438/54, 438/55; 257/E21.087, E21.088
See application file for complete search history.

(56) References Cited

U.S. PATENT DOCUMENTS

| | | | |
|---|---|---|---|
| 6,060,657 A | 5/2000 | Harman | |
| 6,614,109 B2 * | 9/2003 | Cordes et al. | 257/712 |
| 6,818,470 B1 * | 11/2004 | Acklin et al. | 438/55 |
| 7,531,739 B1 | 5/2009 | Moczygemba | |
| 2003/0099279 A1 | 5/2003 | Venkatasubramanian et al. | |
| 2005/0045702 A1 | 3/2005 | Freeman et al. | |
| 2005/0139249 A1 | 6/2005 | Ueki et al. | |
| 2007/0028956 A1 | 2/2007 | Venkatasubramanian et al. | |
| 2009/0277490 A1 | 11/2009 | Chu | |

FOREIGN PATENT DOCUMENTS

| | | |
|---|---|---|
| EP | 1079445 A2 | 2/2001 |
| EP | 2159854 A1 | 3/2010 |
| JP | 01235388 A | 9/1989 |
| JP | 2004221109 A | 8/2004 |
| JP | 2006114554 A | 4/2006 |
| JP | 2008305986 A | 12/2008 |

(Continued)

OTHER PUBLICATIONS

McCann, P.J., et al., "Auger Electron Spectroscopic Analysis of Barium Fluoride Surfaces Exposed to Selenium Vapor", Journal of Electronic Materials, vol. 20, No. 11, Nov. 1991, pp. 915-920.

(Continued)

*Primary Examiner* — Chandra Chaudhari
(74) *Attorney, Agent, or Firm* — Winthrow & Terranova, P.L.L.C.

(57) ABSTRACT

Methods of fabrication of a thermoelectric module from thin film thermoelectric material are disclosed. In general, a thin film thermoelectric module is fabricated by first forming an N-type thin film thermoelectric material layer and one or more metallization layers on a substrate. The one or more metallization layers and the N-type thin film thermoelectric material layer are etched to form a number of N-type thermoelectric material legs. A first electrode assembly is then bonded to a first portion of the N-type thermoelectric material legs, and the first electrode assembly including the first portion of the N-type thermoelectric material legs is removed from the substrate. In a similar manner, a second electrode assembly is bonded to a first portion of a number of P-type thermoelectric material legs. The first and second electrode assemblies are then bonded using a flip-chip bonding process to complete the fabrication of the thermoelectric module.

21 Claims, 29 Drawing Sheets

FOREIGN PATENT DOCUMENTS

| JP | 2009076603 A | 4/2009 |
|---|---|---|
| KR | 100984108 B1 | 9/2010 |
| WO | 9844562 A1 | 10/1998 |
| WO | 2007103249 A2 | 9/2007 |

OTHER PUBLICATIONS

McCann, P.J., et al., "Phase equilibria and liquid phase epitaxy growth of PbSnSeTe lattice matched to PbSe", Journal of Applied Physics, vol. 62, No. 7, Oct. 1, 1987, pp. 2994-3000.

Elizondo, L.A., "Low-Dimensional IV-VI Semiconductor Materials", Ph.D. Dissertation, School of Electrical and Computer Engineering, University of Oklahoma Graduate College, 2008, 273 pages.

Williams, B.S., et al., "Terahertz quantum cascade lasers with double-resonant-phonon depopulation", Applied Physics Letters, vol. 88, No. 26, Jun. 2006, p. 261101-1, 3 pages.

Harman, T.C. et al., "High electrical power density from PbTe-based quantum-dot superlattice unicouple thermoelectric devices", Applied Physics Letters, vol. 88, No. 24, Jun. 2006, p. 243504-1, 3 pages.

Martin, J., et al., "Enhanced Seebeck coefficient through energy-barrier scattering in PbTe nanocomposites," Physical Review B, vol. 79, Issue 11, Mar. 13, 2009, p. 115311-1, 5 pages.

Taylor, P.J., et al., "New Technology for Microfabrication and Testing of a Thermoelectric Device for Generating Mobile Electrical Power," ARL-TR-4480, Army Research Laboratory, Adelphi, Maryland, Jun. 2008, 18 pages.

International Search Report for PCT/US2010/051457 mailed May 13, 2011, 8 pages.

McCann, P.J., et al., "Liquid phase epitaxial growth of PbSe on (111) and (100) BaF2", Journal of Crystal Growth, vol. 114, Issue 4, Dec. 1, 1991, pp. 687-692.

Harman, T.C., et al, "Quantum Dot Superlattice Thermoelectric Materials and Devices (cover story)", Science, vol. 297, Sep. 27, 2002, pp. 2229-2232.

Heremans, J.P., et al, "Enhancement of Thermoelectric Efficiency in PbTe by Distortion of the Electronic Density of States", Science, vol. 321, Jul. 25, 2008, pp. 554-557.

Zeng, G., et al, "Cross-plane Seebeck coefficient of ErAs:InGaAs/InGaAlAs superlattices", Journal of Applied Physics, vol. 101, Issue 3, Feb. 6, 2007, p. 034502-1, 5 pages.

Bian, Z., et al, "Cross-plane Seebeck coefficient and Lorenz number in superlattices", Physical Review B, vol. 76, Issue 20, Nov. 9, 2007, p. 205311-1, 7 pages.

Zide, J.M.O. et al., "Demonstration of electron filtering to increase the Seebeck coefficient in In0.53Ga0.47As/In0.53Ga0.28Al0.19As superlattices", Physical Review B, vol. 74, Issue 20, Nov. 30, 2006, p. 205335-1, 5 pages.

Elizondo, L.A., et al, "Optically pumped mid-infrared light emitter on silicon", Journal of Applied Physics, vol. 101, Issue 10, May 22, 2007, p. 104504-1, 6 pages.

McCann, P.J., "IV-VI Semiconductors for Mid-infrared Optoelectronic Devices", Mid-Infrared Semiconductor Optoelectronics (book), edited by A. Krier, Springer-Verlog, London, 2006, pp. 237-264.

Li, Y.F., et al, "Transfer of IV-VI multiple quantum well structures grown by molecular beam epitaxy from Si substrates to copper", Thin Solid Films, vol. 488, Issues 1-2, Sep. 22, 2005, pp. 178-184.

McCann, P.J., et al., "Optical pumping of IV-VI semiconductor multiple quantum well materials using a GaSb-based laser with emission at $\lambda=2.5$ μm", Journal of Applied Physics, vol. 97, Issue 5, Mar. 2005, p. 053103-1, 4 pages.

Li, Y.F. et al., "Improvement in Heat Dissipation by Transfer of IV-VI Epilayers From Silicon to Copper", IEEE Photonics Technology Letters, vol. 16, No. 11, Nov. 2004, pp. 2433-2435.

Zasavitskii, I.I., et al., "Optical deformation potentials for PbSe and PbTe", Physical Review B, vol. 70, Issue 11, Sep. 8, 2004, p. 115302-1, 10 pages.

McCann, P.J., "IV-VI Semiconductor Materials, Devices, and Applications", State-of-the-Art Program on Compound Semiconductors and Narrow Bandgap Optoelectronic Materials and Devices (book), edited by D. Buckley et al., The Electrochemical Society (ISBN 1-56677-407-1), New Jersey, 2004, p. 218, 16 pages.

Schiessl, U.P., et al., "Lead-Chalcogenide-based Mid-Infrared Diode Lasers", Long-Wavelength Infrared Semiconductor Lasers (book), p. 145, edited by H. K. Choi, Wiley (ISBN 0-471-39200-6), New Jersey, 2004.

Rappl, P.H.O., et al., "Development of a Novel Epitaxial Layer Segmentation Method for Optoelectronic Device Fabrication", IEEE Photonics Technology Letters, vol. 15, Mar. 2003, No. 3, pp. 374-376.

Wu, H.Z., et al., "Experimental determination of deformation potentials and band nonparabolicity parameters for PbSe", Physical Review B, vol. 66, Issue 4, Jul. 9, 2002, p. 045303-1, 7 pages.

Shen, W.Z., et al., "Excitonic line broadening in PbSrSe thin films grown by molecular beam epitaxy", Journal of Applied Physics, vol. 91, No. 6, Mar. 15, 2002, pp. 3621-3625.

Shen, W.Z., et al., "Band gaps, effective masses and refractive indices of PbSrSe thin films: Key properties for mid-infrared optoelectronic device applications", Journal of Applied Physics, vol. 91, Issue 1, Jan. 1, 2002, pp. 192-198.

Shen, W.Z., et al., "Study of band structure in PbSe/PbSrSe quantum wells for midinfrared laser applications", Applied Physics Letters, vol. 79, No. 16, Oct. 15, 2001, pp. 2579-2581.

Jin, J.S., et al.. "Photoelectric properties of PbSe/BaF2/CaF2 films on Si(111) (abstract)," Journal of Infrared and Millimeter Waves, vol. 20, Apr. 2001, pp. 154-156.

Wu, H.Z., et al., "Molecular beam epitaxial growth of IV-VI multiple quantum well structures on Si(111) and BaF2(111) and optical studies of epilayer heating", Journal of Vacuum Science and Technology B, vol. 19, No. 4, Jul./Aug. 2001, pp. 1447-1454.

Wu, H.Z., et al., "Unambiguous observation of subband transitions from longitudinal valley and oblique valleys in IV-VI multiple quantum wells", Applied Physics Letters, vol. 78, No. 15, Apr. 9, 2001, pp. 2199-2201.

McAlister, D.W., et al., "Midinfrared photoluminescence from IV-VI semiconductors grown on silicon", Journal of Applied Physics, vol. 89, No. 6, Mar. 15, 2001, pp. 3514-3516.

Yang, A.L., et al., "Raman Scattering Study of PbSe Grown on (111) BaF2 Substrate", Chinese Physics Letters, vol. 17, No. 8, Aug. 2000, pp. 606-608.

Shi, Z., et al., "IV-VI compound midinfrared high-reflectivity mirrors and vertical-cavity surface-emitting lasers grown by molecular beam epitaxy", Applied Physics Letters, vol. 76, No. 25, Jun. 19, 2000, pp. 3688-3700.

Fang, X.M., et al., "Molecular beam epitaxy of PbSrSe and PbSe/PbSrSe multiple quantum well structures for use in midinfrared light emitting devices", Journal of Vacuum Science and Technology B, vol. 18, Issue 3, May/Jun. 2000, pp. 1720-1723.

Xu, G., et al., "MBE growth of wide band gap Pb1-xSrxSe on Si(111) substrate", Journal of Crystal Growth, vol. 209, Issue 4, Feb. 2, 2000, pp. 763-766.

McAlister, D.W., et al.,"Fabrication of Thin Film Cleaved Cavities Using a Bonding and Cleaving Fixture", IEEE Photonics Technology Letters, vol. 12, Issue 1, Jan. 2000, pp. 22-24.

Li, C.P., et al., "Strain relaxation in PbSnSe and PbSe/PbSnSe layers grown by liquid phase epitaxy on (100)-oriented silicon", Journal of Crystal Growth, vol. 208, Issues 1-4, Jan. 2000, pp. 423-430.

McCann, P.J., et al., "Above-room-temperature continuous wave mid-infrared photoluminescence from PbSe/PbSrSe quantum wells", Applied Physics Letters, vol. 75, No. 23, Dec. 6, 1999, pp. 3608-3610.

Wu, H.Z. et al., "Transfer of PbSe/PbEuSe epilayers grown by MBE on BaF2-coated Si(111)", Thin Solid Films, vol. 352, Issues 1-2, Sep. 8, 1999, pp. 278-282.

McCann, P.J., et al., "IV-VI Semiconductor growth on silicon substrates and new mid-infrared laser fabrication methods," Spectrochimica Acta, Part A: Molecular and Biomolecular Spectroscopy, vol. 55, Sep. 1, 1999, pp. 1999-2005.

Fang, X.M., et al., "Molecular beam epitaxy of periodic BaF2/PbEuSe layers on Si(111)", Journal of Vacuum Science and Technology B, vol. 17, No. 3, May/Jun. 1999, pp. 1297-1300.

Wu, H.Z., et al., "Molecular beam epitaxy growth of PbSe on BaF2-coated Si(111) and observation of the PbSe growth interface", Journal of Vacuum Science and Technology B, vol. 17, No. 3, May/Jun. 1999, pp. 1263-1266.

Sachar, H.K., et al., "Growth and characterization of PbSe and Pb1-xSnxSe on Si(100)", Journal of Applied Physics vol. 85, No. 10, May 15, 1999, pp. 7398-7403.

Fang, X.M., et al., "Molecular beam epitaxial growth of Bi2Se3- and Tl2Se-doped PbSe and PbEuSe on CaF2/Si(111)", Journal of Vacuum Science and Technology B, vol. 16, No. 3, May/Jun. 1998, pp. 1459-1462.

Chao, I.-N., et al., "Growth and characterization of IV-VI semiconductor heterostructures on (100) BaF2", Thin Solid Films, vol. 323, Issue 1-2, Jun. 22, 1998, pp. 126-135.

McCann, P.J., et al., "MBE growth of PbSe/CaF2/Si(111) heterostructures", Journal of Crystal Growth, vols. 175/176, Part 2, May 1, 1997, pp. 1057-1062.

Strecker, B.N., et al., "LPE Growth of Crack-Free PbSe Layers on Si(100) Using MBE-Grown PbSe/BaF2/CaF2 Buffer Layers", Journal of Electronic Materials, vol. 26, No. 5, May 5, 1997, pp. 444-448.

Erchak, A., "PhlatLight: A New Solid-State Light Source", Key Conference on Compound Semiconductors, Key West, FL, Mar. 2-4, 2008, www.luminus.com/stuff/contentmgr/files/0/4faaea3eaca9c134990b0b74f17a3c70/pdf/key_conference_2008_erchak.pdf, accessed Sep. 4, 2008, 21 pages.

Fleurial, J.-P., et al., "Solid-state power generation and cooling micro/nanodevices for distributed system architectures," IEEE 20th International Conference on Thermoelectrics, Beijing, China, Jun. 8-11, 2001, pp. 24-29.

Caylor, J.C., et al., "Enhanced thermoelectric performance in PbTe-based superlattice structures from reduction of lattice thermal conductivity", Applied Physics Letters, vol. 87, No. 2, Jul. 8, 2005, p. 023105-1, 3 pages.

Mahan, G.D., et al, "Multilayer Thermionic Refrigeration", Physical Review Letters, vol. 80, No. 18, May 4, 1998, pp. 4016-4019.

Kucherov, Y., et al., "Importance of barrier layers in thermal diodes for energy conversion," Journal of Applied Physics, vol. 97, Issue 9, Apr. 14, 2005, p. 094902-1, 8 pages.

Kim, W., et al., "Cross-plane lattice and electronic thermal conductivities of ErAs:InGaAs/InGaAlAs superlattices", Applied Physics Letters, vol. 88, No. 24, Jun. 13, 2006, p. 242107-1, 3 pages.

McCann, P.J., et al., "Optical properties of ternary and quaternary IV-VI semiconductor layers on (100) BaF2 substrates", Applied Physics Letters, vol. 66, No. 11, Jan. 2, 1995, pp. 1355-1357.

McCann, P.J., et al., "Growth and characterization of thallium- and gold doped PbSe0.78Te0.22 layers lattice matched with BaF2 substrates", Applied Physics Letters, vol. 65, No. 17, Oct. 24, 1994, pp. 2185-2187.

McCann, P.J., et al., "The role of graphite boat design in liquid phase epitaxial growth of PbSe0.78Te0.22 on BaF2", Journal of Crystal Growth, vol. 141, Issues 3-4, Aug. 2, 1994, pp. 376-382.

McCann, P.J., et al., "Liquid phase epitaxy growth of Pb1-xSnxSe1-yTey alloys lattice matched with BaF2", Journal of Applied Physics, vol. 75, No. 2, Jan. 15, 1994, pp. 1145-1150.

McCann, P.J., et al., "Growth of PbSe0.78Te0.22 lattice-matched with BaF2", Thin Solid Films, vol. 227, Issue 2, May 10, 1993, pp. 185-189.

* cited by examiner

METHOD FOR THIN FILM THERMOELECTRIC MODULE FABRICATION

RELATED APPLICATIONS

This application claims the benefit of provisional patent application Ser. No. 61/248,691, filed Oct. 5, 2009, the disclosure of which is hereby incorporated herein by reference in its entirety.

FIELD OF THE DISCLOSURE

The present disclosure relates to thermoelectric modules and more specifically relates to fabrication of thin film thermoelectric modules.

BACKGROUND

Technologies based upon semiconductor materials and devices have a remarkable track record of commercial achievement. Silicon-based solid state electronics have given us computing technology that has doubled in performance every two years (Moore's Law) for over forty years. Additionally, compound semiconductor optoelectronics, mostly Gallium Arsenide (GaAs) and Indium Phosphide (InP) based III-V semiconductor laser diodes, have given us communications technology that doubles the data coming out of an optical fiber every nine months (Butter's Law of Photonics). Semiconductor technology is now being applied to energy and energy efficiency. Solar cell devices based on Silicon and other semiconductor materials have recently experienced significant commercial success. However, it is widely recognized that there is little room left for significant improvement in solar cell power production efficiencies. In other words, there appears to be no equivalent opportunity for a Moore's Law type of improvement with solar cells. By contrast, thermoelectric materials for power generation from heat sources are increasingly being recognized as having the potential for a Moore's Law type of sustained performance improvement in the clean technology area.

In general, thermoelectric materials can be used to form thermoelectric generators and thermoelectric coolers. More specifically, FIG. 1A illustrates a traditional two-leg thermoelectric generator (TEG) 10. As illustrated, the TEG 10 includes a bulk-shaped N-type thermoelectric material 12, a bulk-shaped P-type thermoelectric material 14, a top conductive metal layer 16, and a bottom conductive metal layer 18. In order to generate power, heat is applied to the top conductive metal layer 16, thereby creating a heat differential between the top conductive metal layer 16 and the bottom conductive metal layer 18. This heat differential induces electrical current flow in the TEG 10 as illustrated. The electrical current flow through the N-type thermoelectric material 12 and the P-type thermoelectric material 14 is parallel to the direction of heat transference in the TEG 10. The induced electrical current flow supplies power to a resistive load 20.

FIG. 1B illustrates a traditional two-leg thermoelectric cooler (TEC) 22. Like the TEG 10, the TEC 22 includes a bulk-shaped N-type thermoelectric material 24, a bulk-shaped P-type thermoelectric material 26, a top conductive metal layer 28, and a bottom conductive metal layer 30. In order to effect thermoelectric cooling, an electrical current is applied to the TEC 22 as shown. The direction of current transference in the N-type thermoelectric material 24 and the P-type thermoelectric material 26 is parallel to the direction of heat transference in the TEC 22. As a result, cooling occurs at the top conductive metal layer 28 by absorbing heat at the top surface of the TEC 22 and releasing heat at the bottom surface of the TEC 22.

The primary figure of merit for thermoelectric materials is ZT, where ZT is defined as:

$$ZT = S^2 \sigma T/k,$$

where S is the Seebeck coefficient of the thermoelectric material, $\sigma$ is the electrical conductivity of the thermoelectric material, k is the thermal conductivity of the thermoelectric material, and T is the temperature in kelvins. Thus, a good thermoelectric material will have low thermal conductivity, high electrical conductivity, and a high Seebeck coefficient. Presently, commercial thermoelectric materials have ZT values of around 1.0. However, ZT values of 3.0 or higher are desired. As such, there is a need for a thermoelectric material having a high ZT value.

Embodiments of a thin film thermoelectric material having a high ZT value are disclosed herein. Because the disclosed thermoelectric material is a thin film material, traditional pick-and-place techniques used to fabricate thermoelectric modules cannot be used. More specifically, traditional thermoelectric modules are formed from traditional thermoelectric devices such as those of FIGS. 1A and 1B. These traditional thermoelectric devices have bulk shaped thermoelectric material legs, which have dimensions on the order of millimeters. In contrast, the thin film thermoelectric material disclosed herein results in thermoelectric devices having thermoelectric material legs having dimensions on the order of a few to tens of microns. As such, the traditional pick-and-place techniques that are used to fabricate traditional thermoelectric devices having thermoelectric material legs on the millimeter scale are not suitable for use in fabrication of thermoelectric devices having thermoelectric material legs on the micrometer scale. As such, there is also a need for a method of fabricating a thin film thermoelectric module.

SUMMARY

Methods of fabrication of a thermoelectric module from thin film thermoelectric material are disclosed. In general, a thin film thermoelectric module is fabricated by first forming an N-type thin film thermoelectric material layer on a substrate. One or more metallization layers are then formed on the N-type thin film thermoelectric material layer. The one or more metallization layers and the N-type thin film thermoelectric material layer are then etched to form a number of N-type thermoelectric material legs. A first electrode assembly is then bonded to a first portion of the N-type thermoelectric material legs, and the first electrode assembly including the first portion of the N-type thermoelectric material legs is removed from the substrate. In a similar manner, a P-type thin film thermoelectric material layer is formed on a substrate. One or more metallization layers are formed on the P-type thin film thermoelectric material layer. The one or more metallization layers and the P-type thin film thermoelectric material layer are then etched to form a number of P-type thermoelectric material legs. A second electrode assembly is then bonded to a first portion of the P-type thermoelectric material legs, and the second electrode assembly including the first portion of the P-type thermoelectric material legs is removed from the substrate. The first and second electrode assemblies, including the N-type and P-type thermoelectric material legs bonded thereto, are then bonded using a flip-chip bonding process to complete the fabrication of the thermoelectric module.

In one embodiment, a third electrode assembly is bonded to a remaining portion of the N-type thermoelectric material legs, and the third electrode assembly including the remaining portion of the N-type thermoelectric material legs is removed from the substrate. A fourth electrode assembly is then bonded to a remaining portion of the P-type thermoelectric material legs, and the fourth electrode assembly including the remaining portion of the P-type thermoelectric material legs are removed from the substrate. The third and fourth electrode assemblies, including the N-type and P-type thermoelectric material legs bonded thereto, are then bonded using a flip-chip bonding process to complete fabrication of the second thermoelectric module.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

Figure 4:
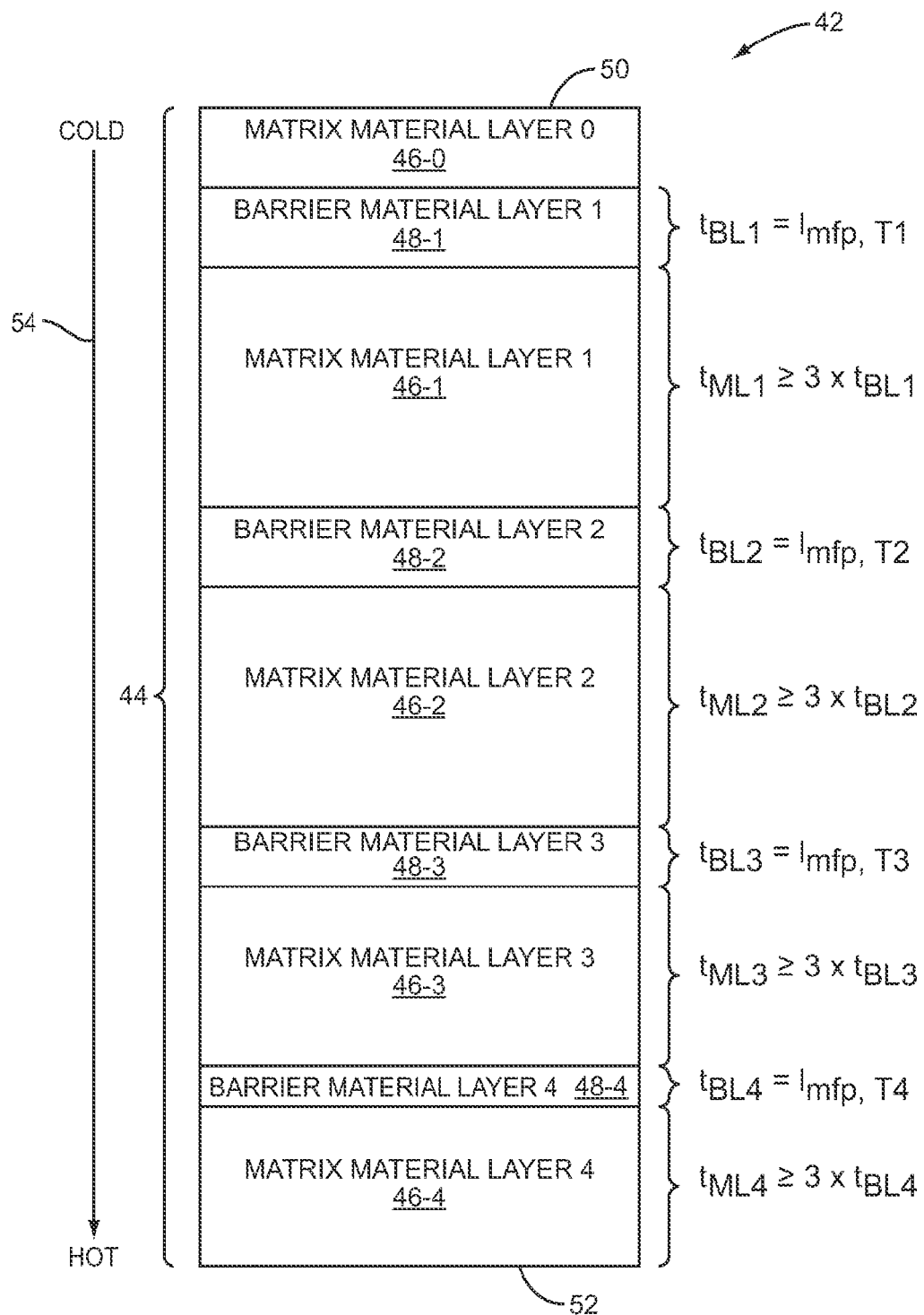
Figure 5:
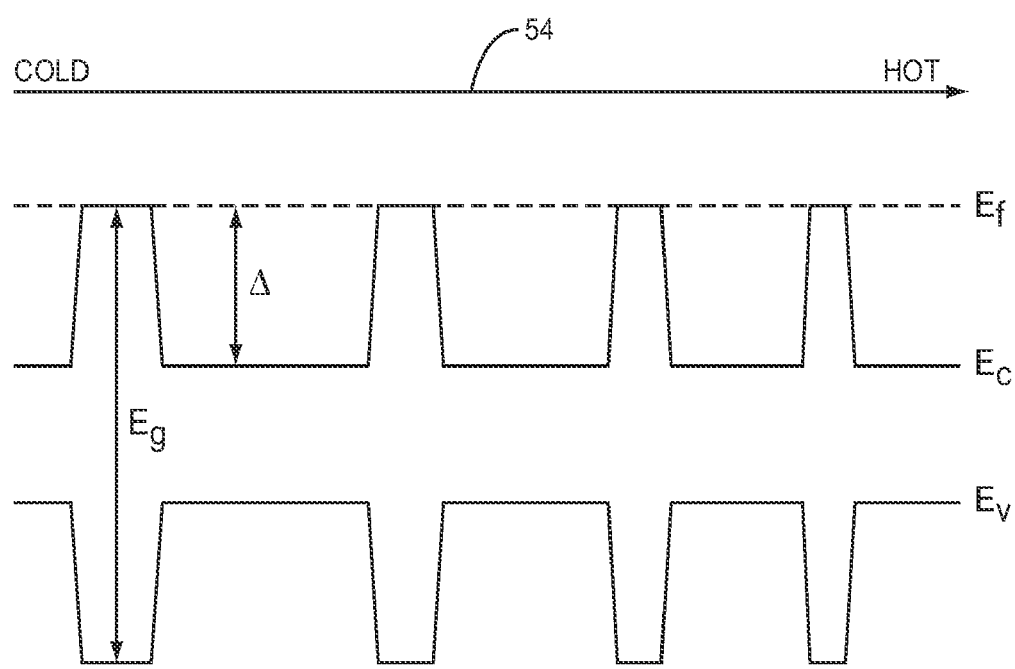
Figure 6:
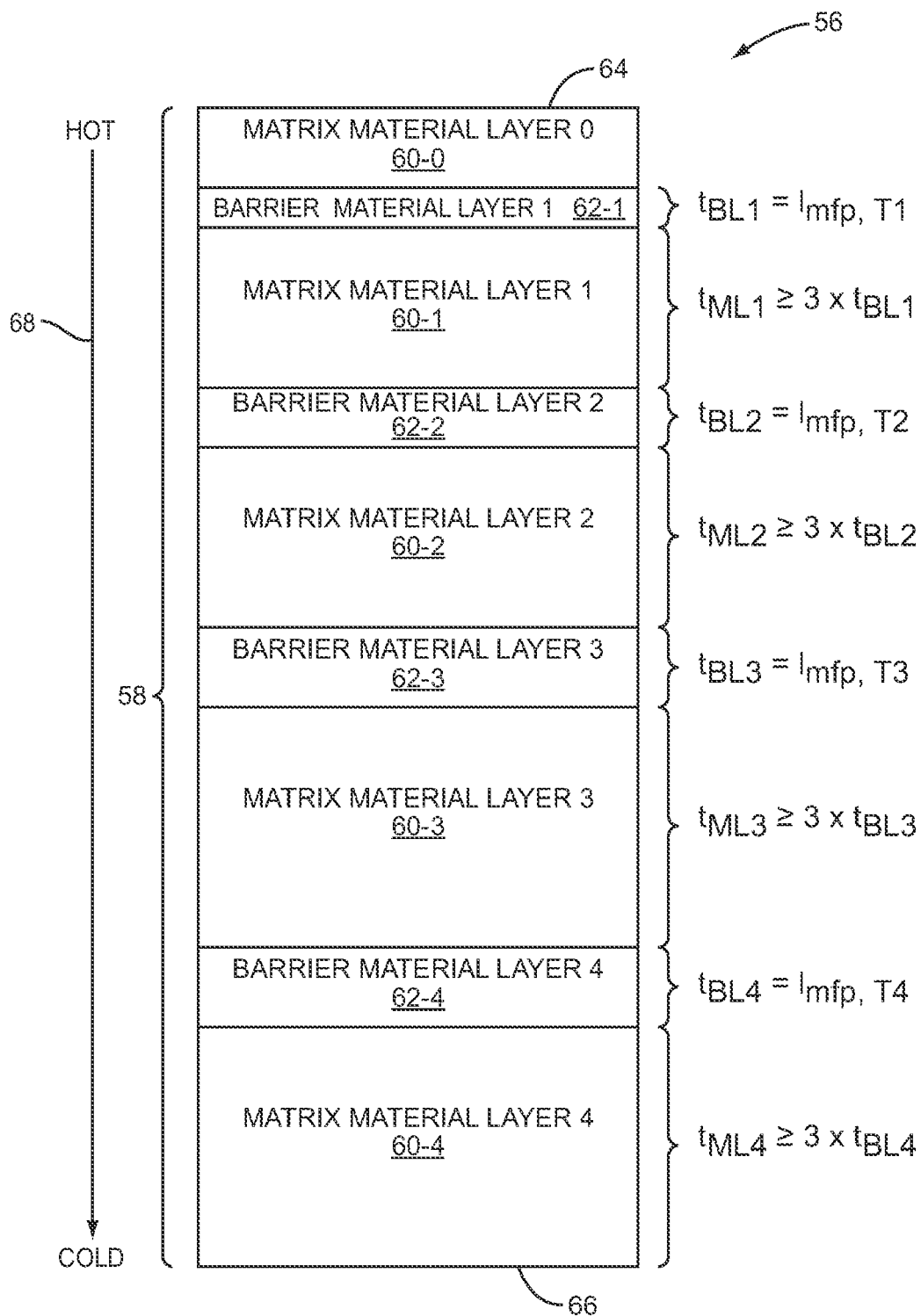
Figure 7:
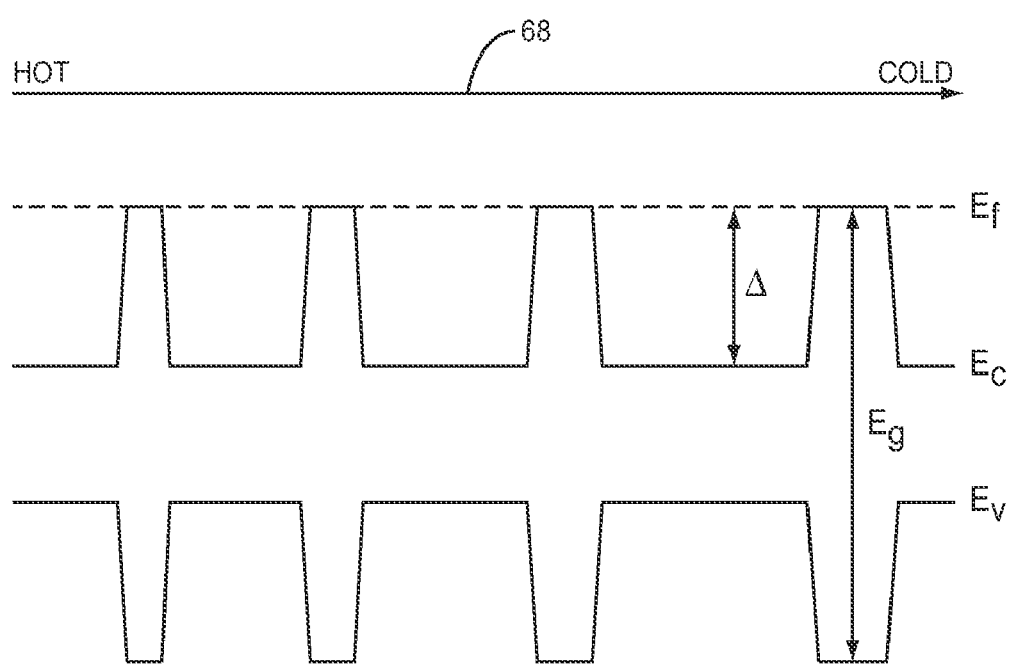
Figure 8:
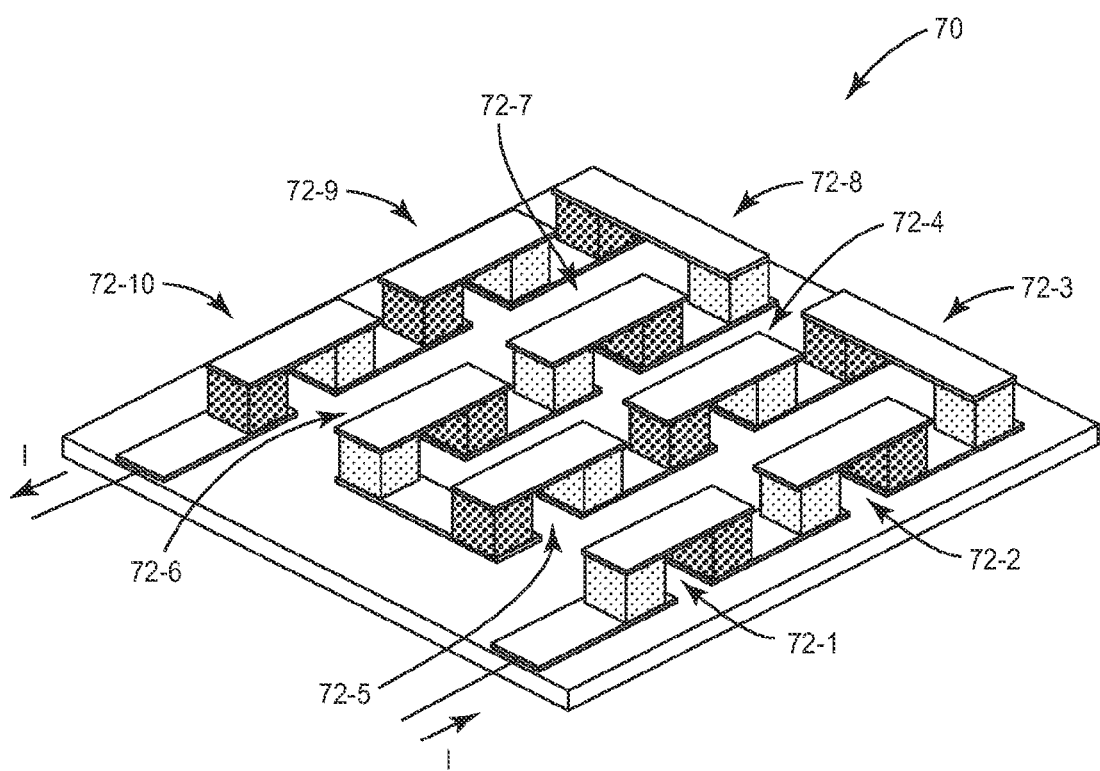
Figure 10A:
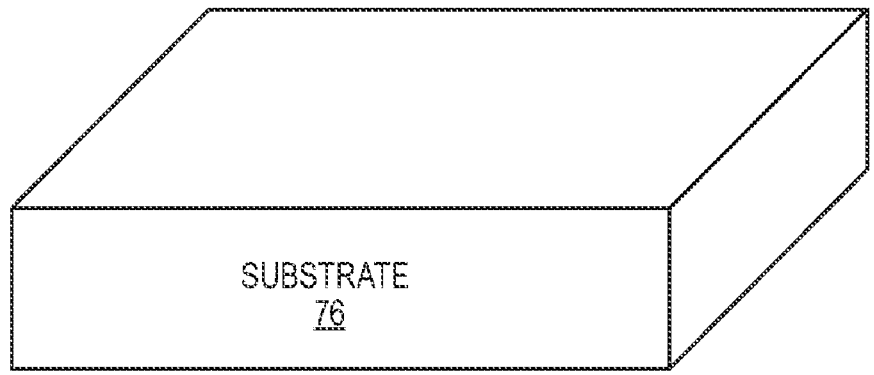
Figure 10B:
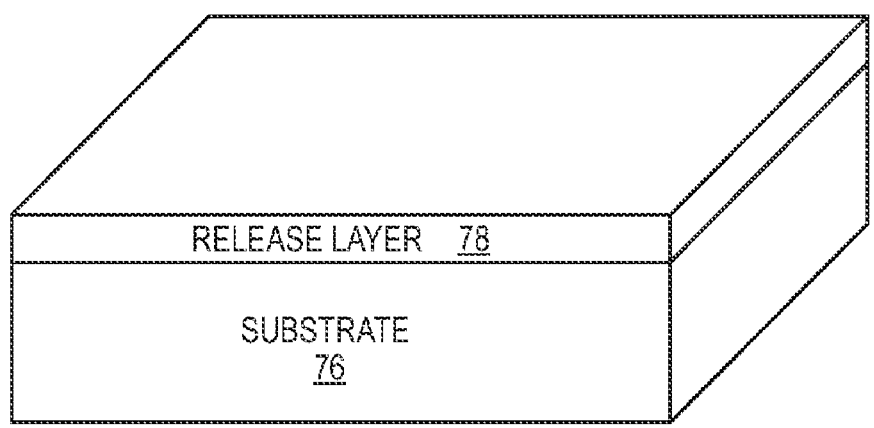
Figure 10C:
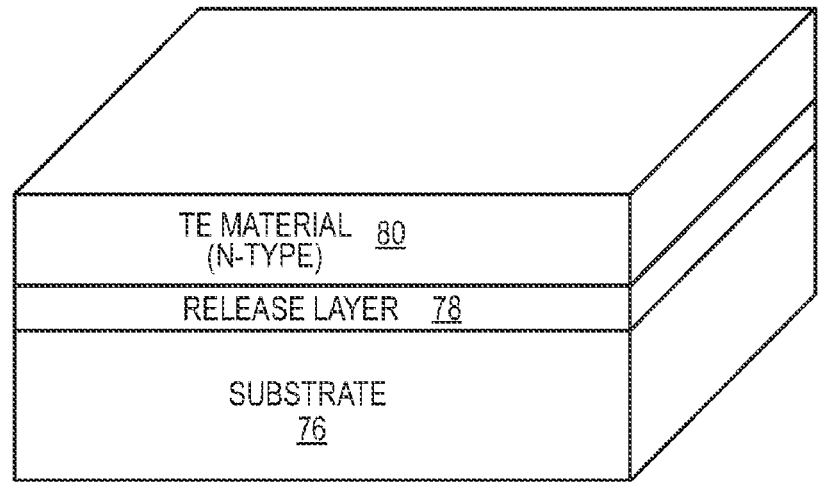
Figure 10D:
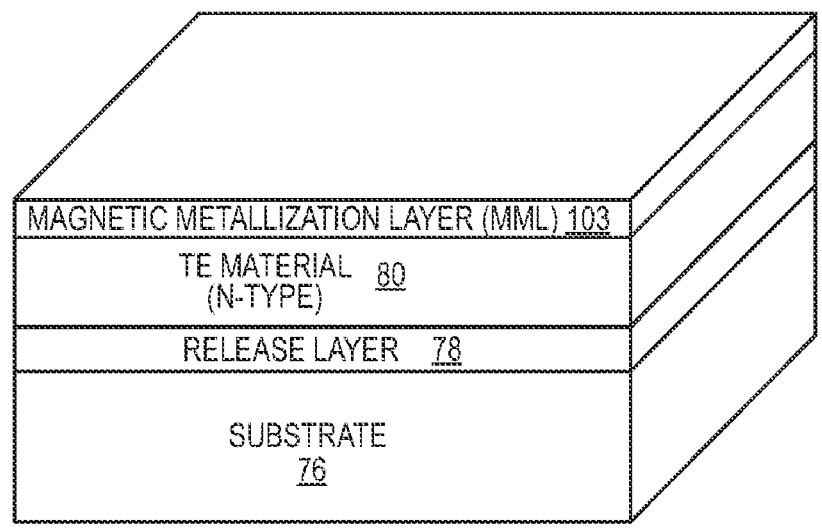
Figure 10E:
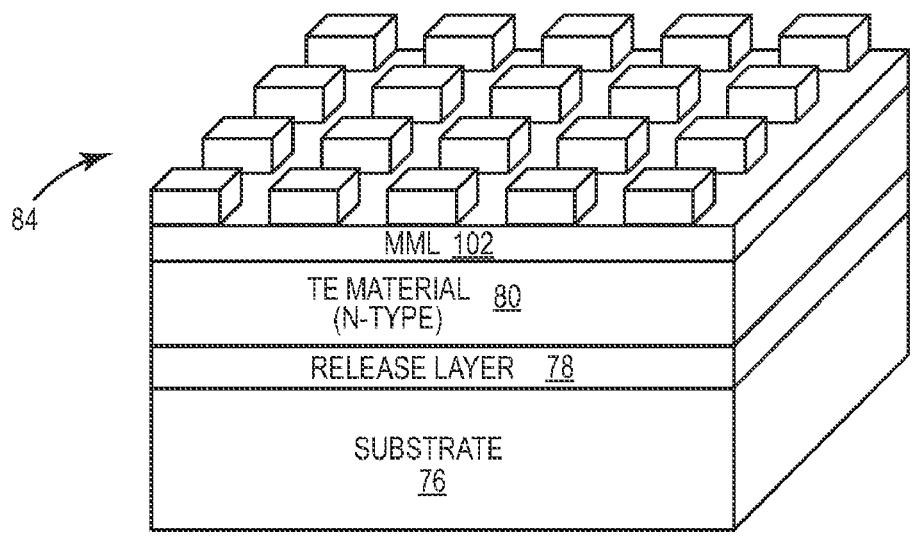
Figure 10F:
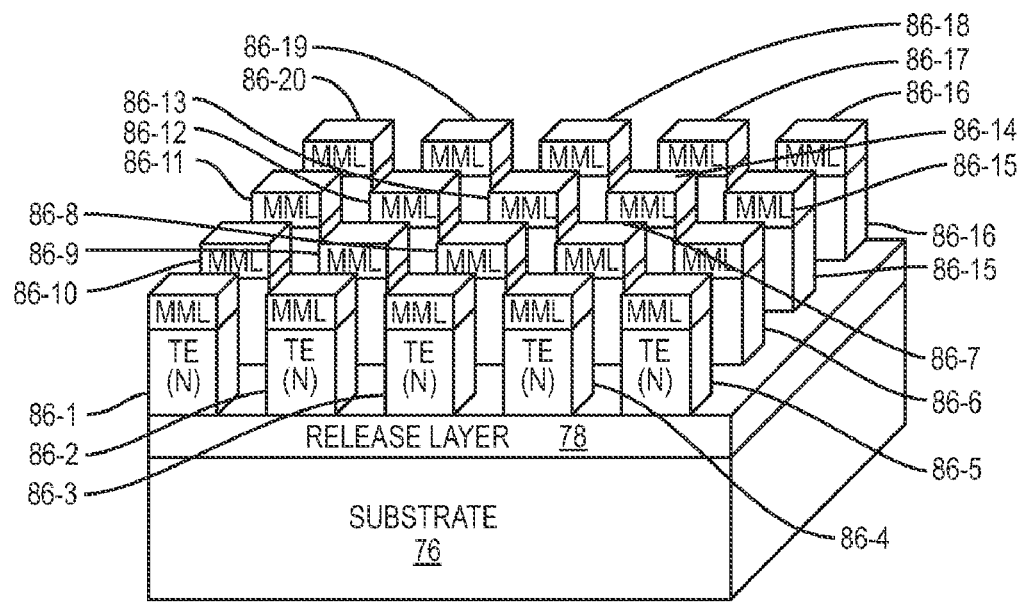
Figure 10G:
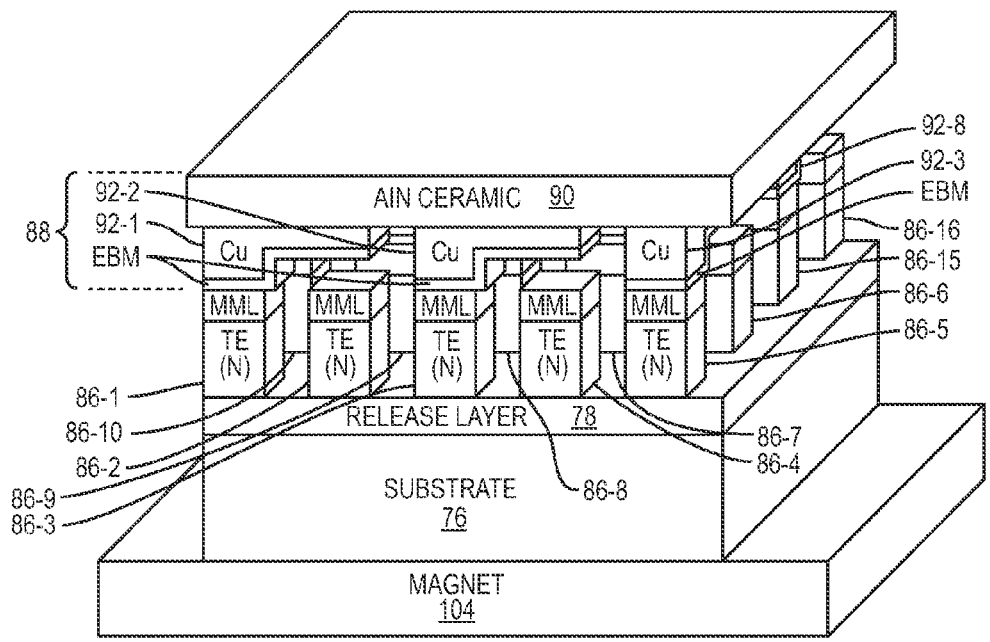
Figure 10H:
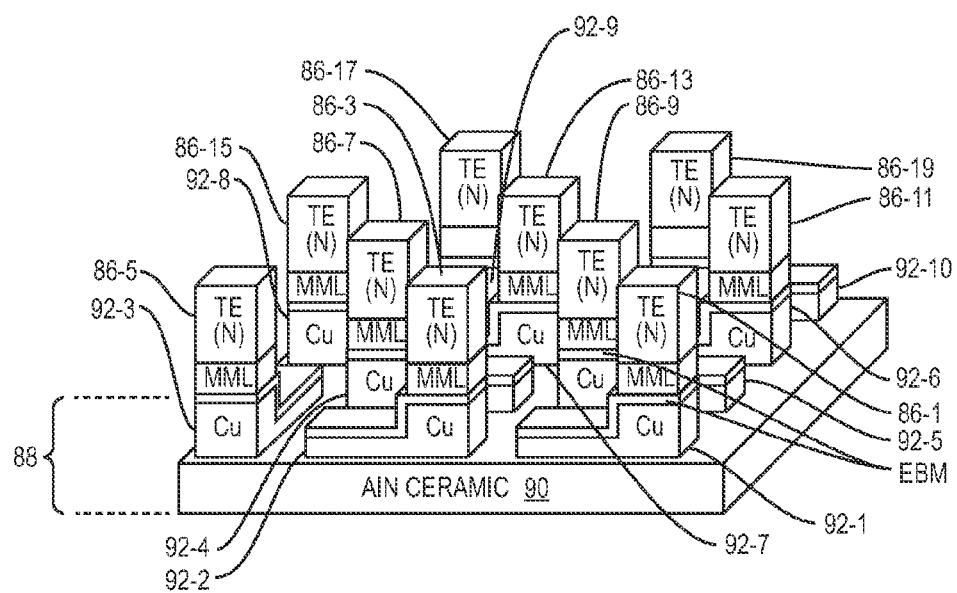
Figure 10I:
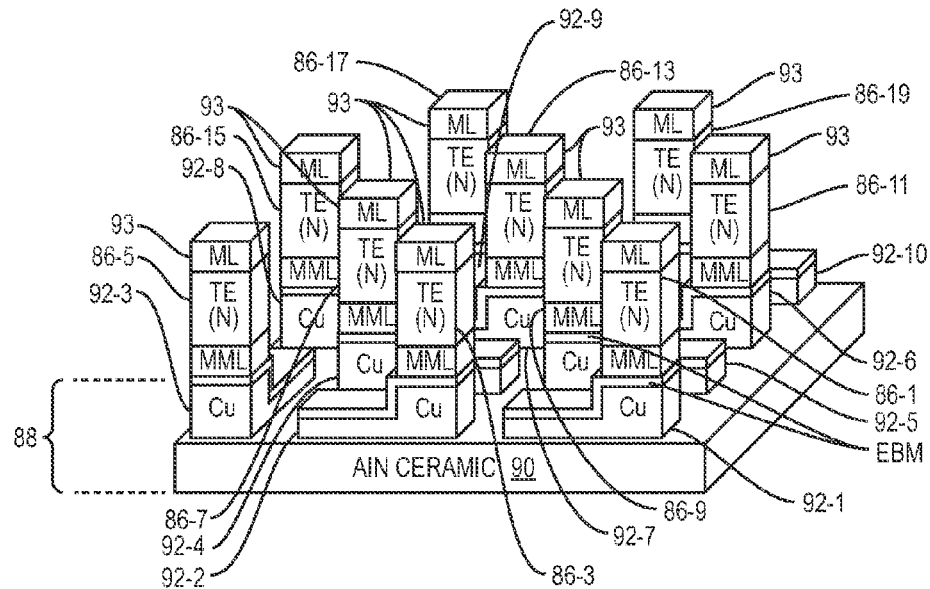
Figure 10J:
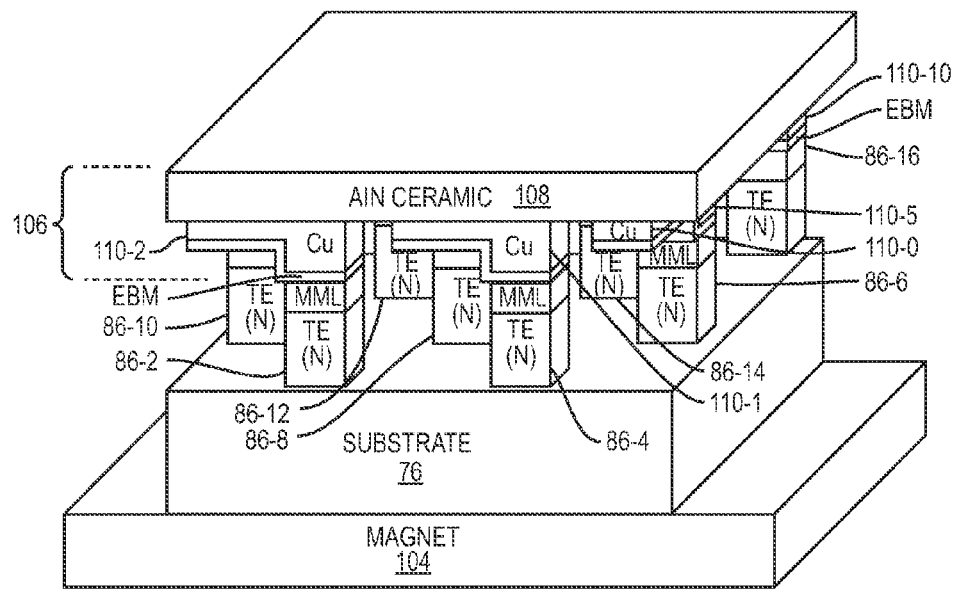
Figure 10K:
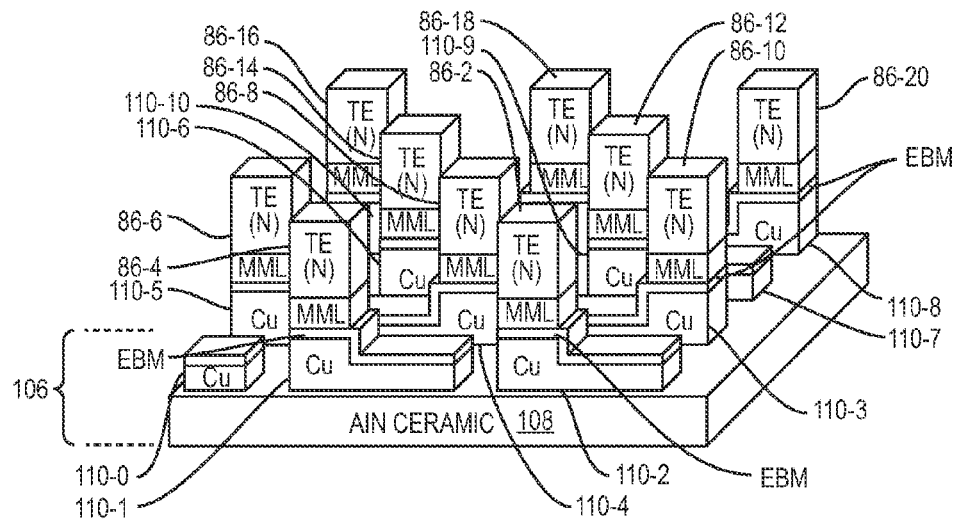
Figure 10L:
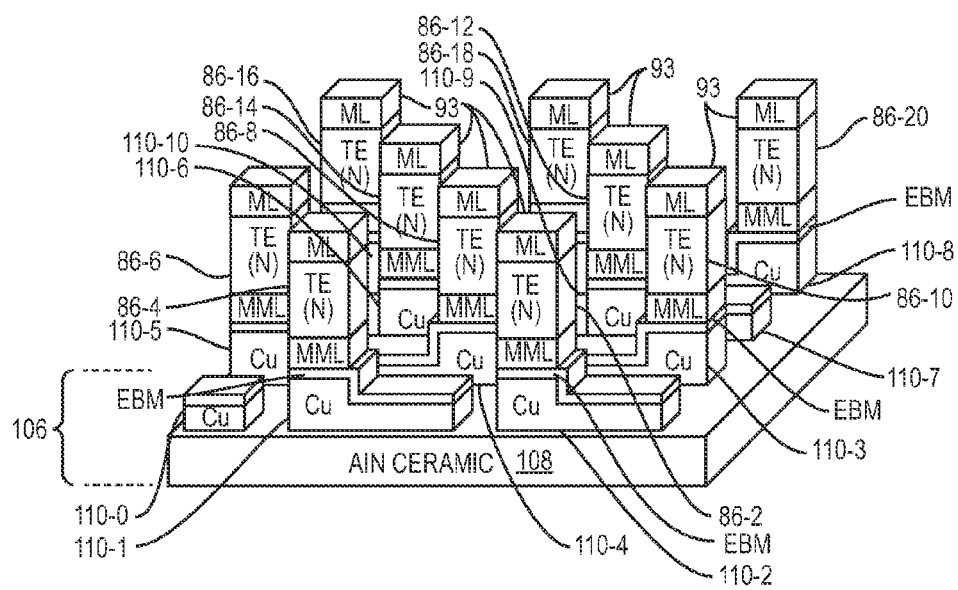
Figure 10M:
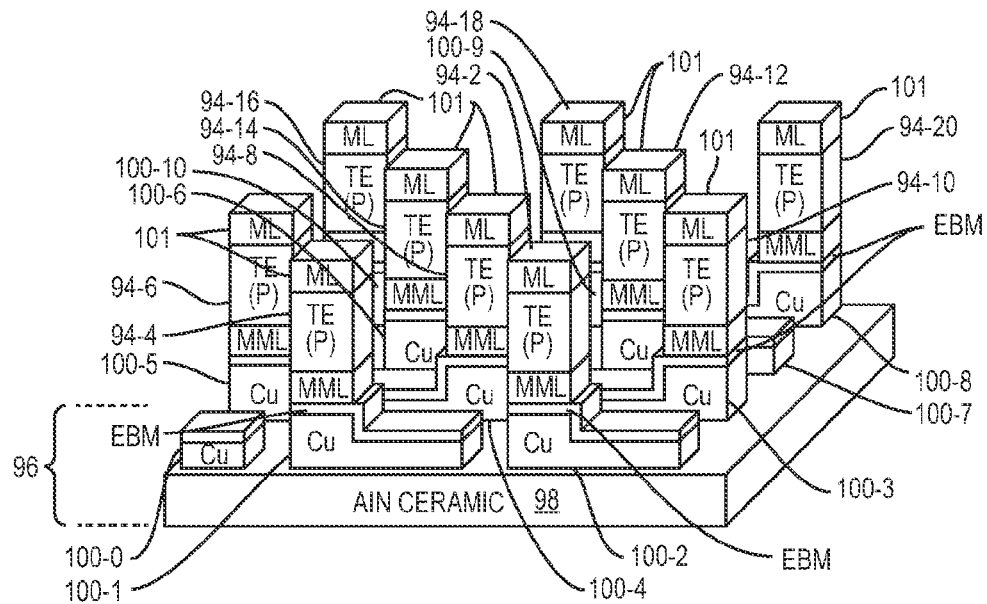
Figure 10N:
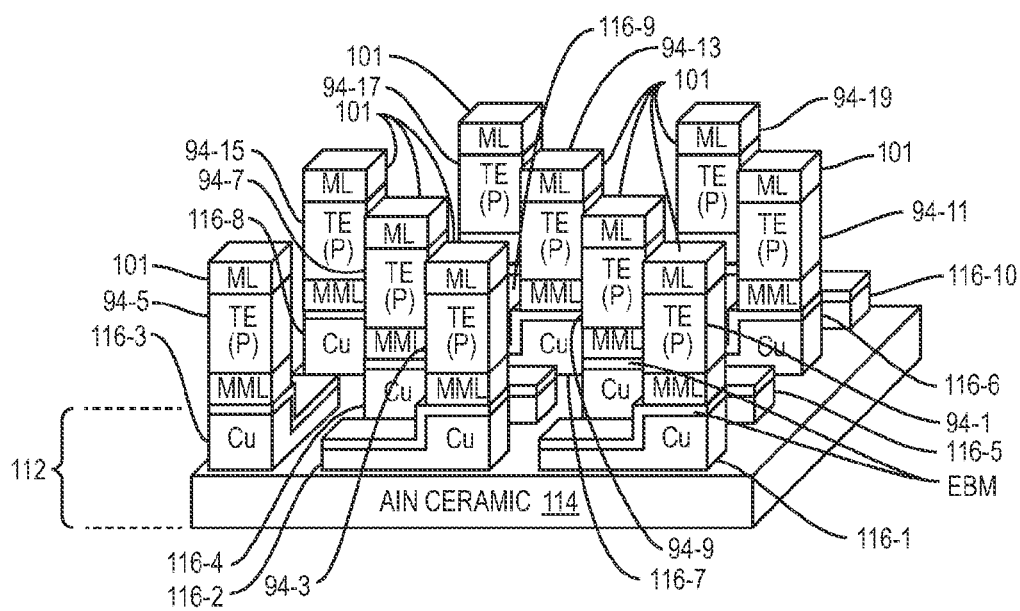
Figure 10O:
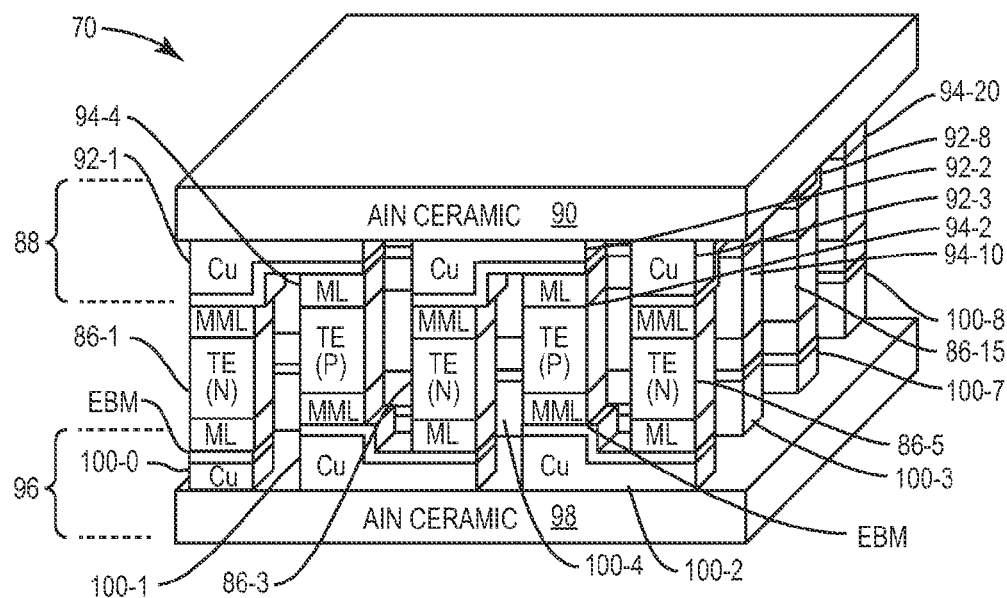
Figure 10P:
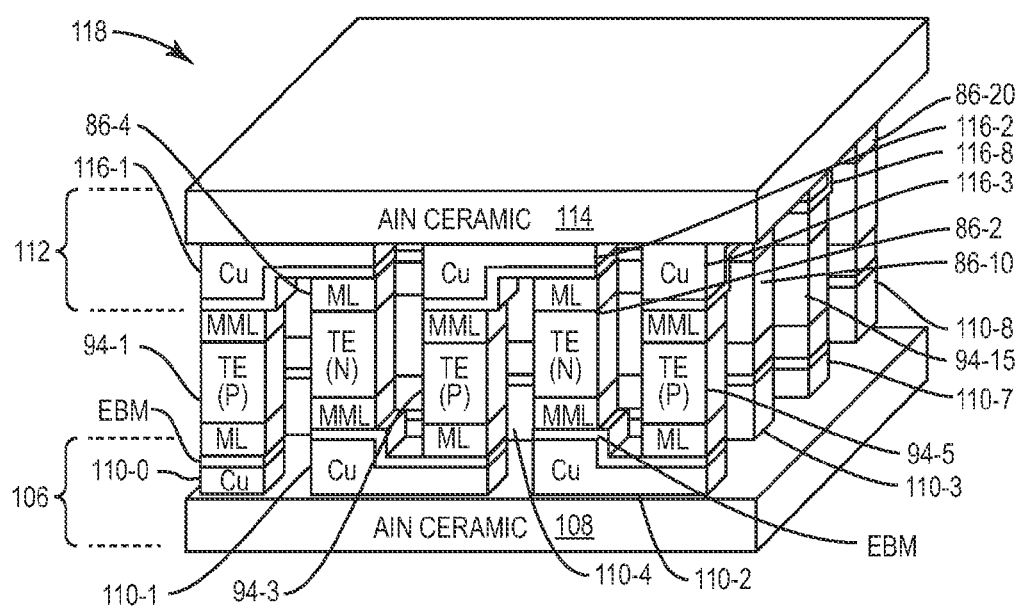
Figure 11A:
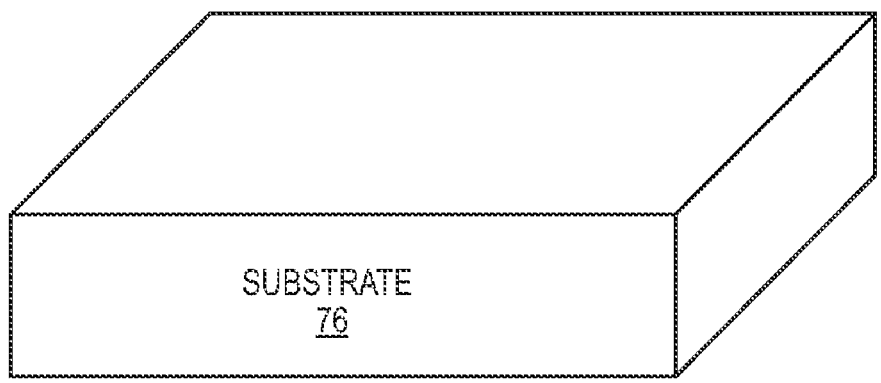
Figure 11B:
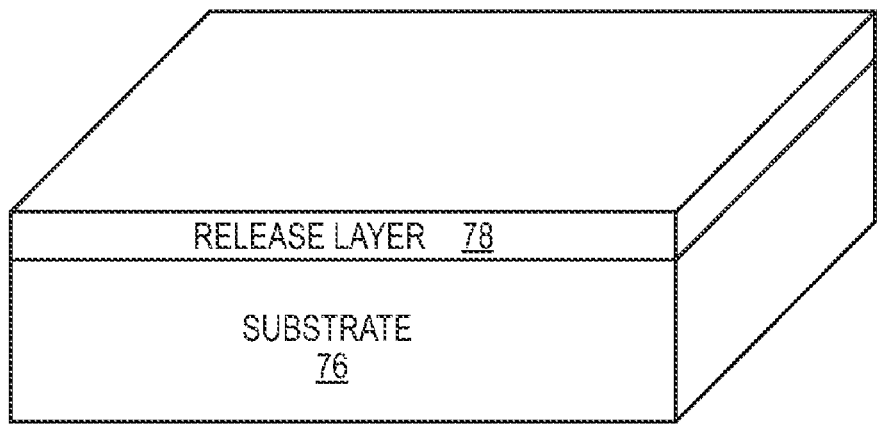
Figure 11C:
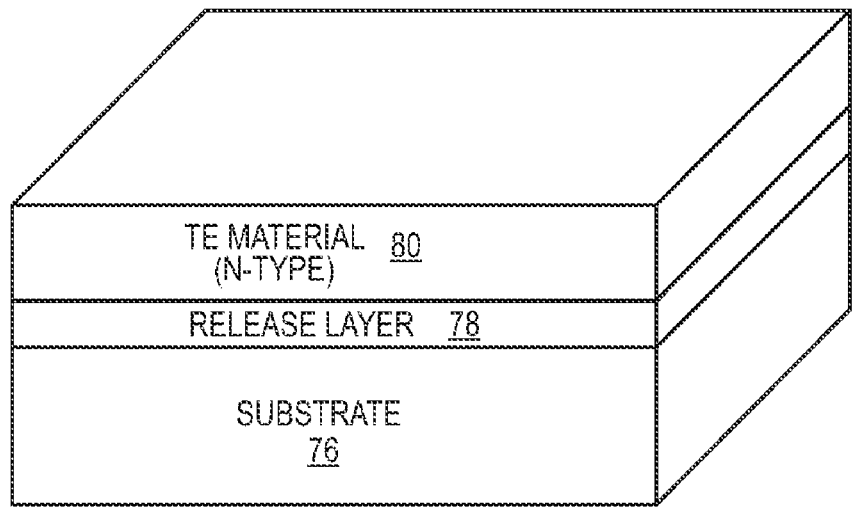
Figure 11D:
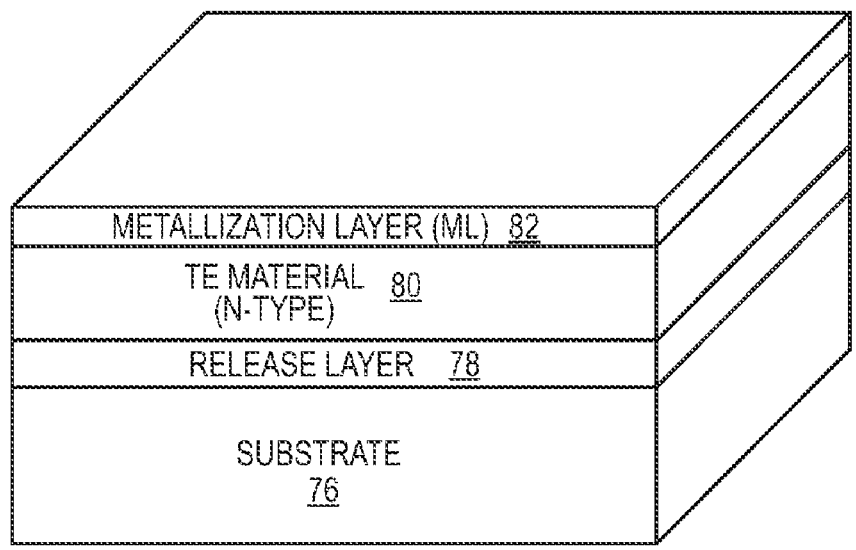
Figure 11E:
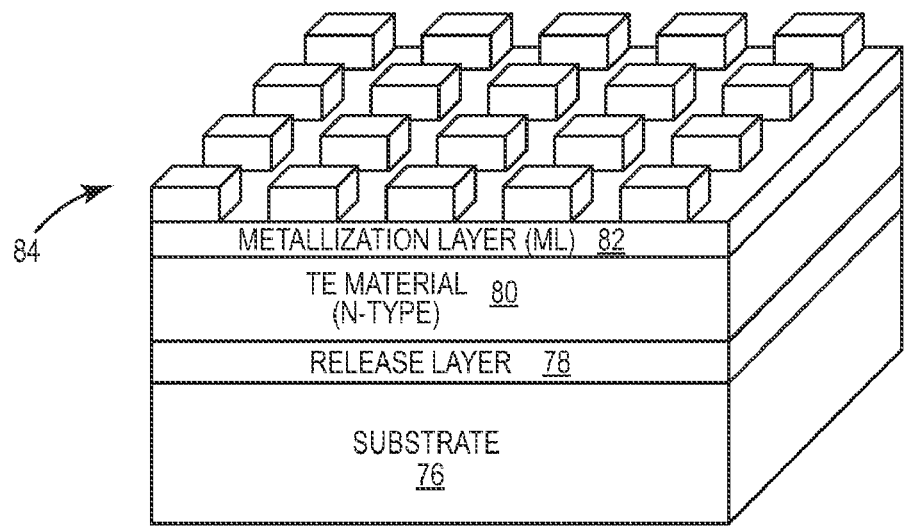
Figure 11F:
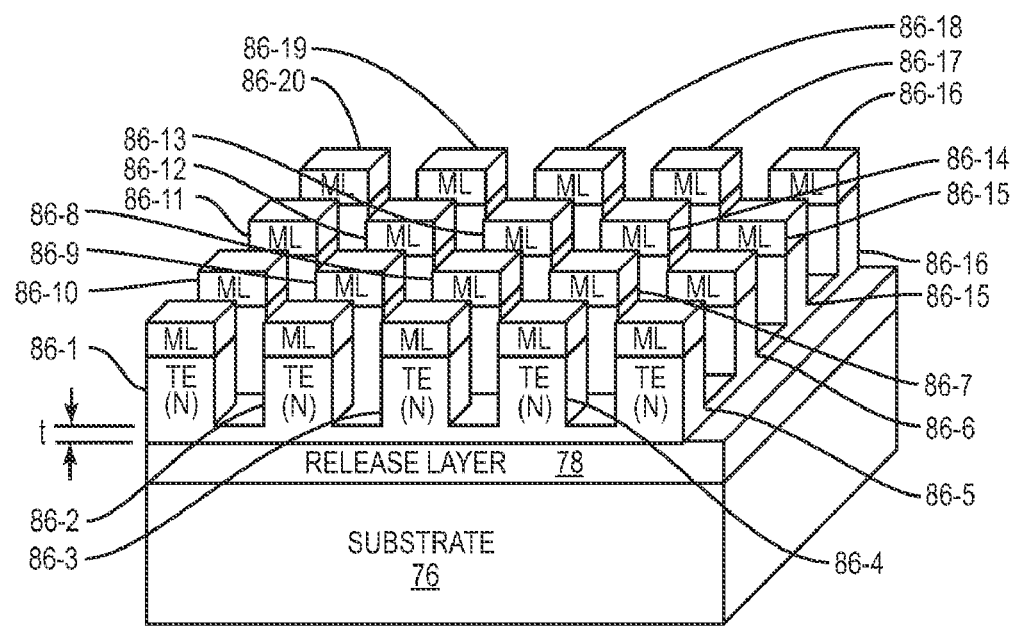
Figure 11G:
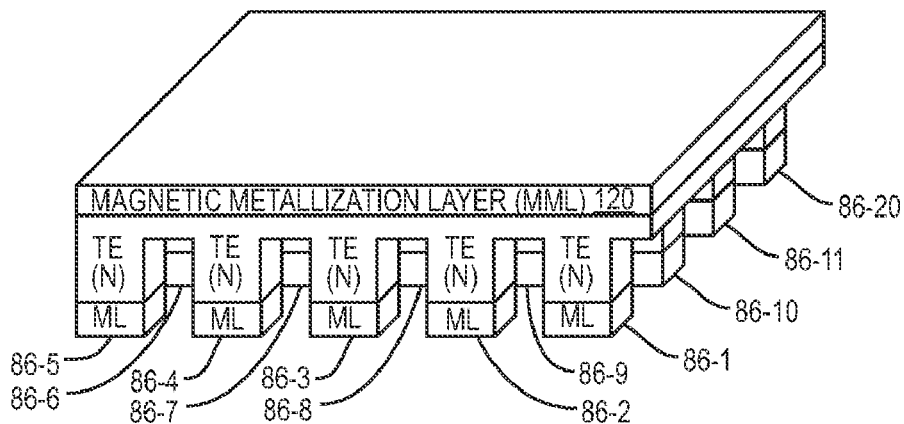
Figure 11H:
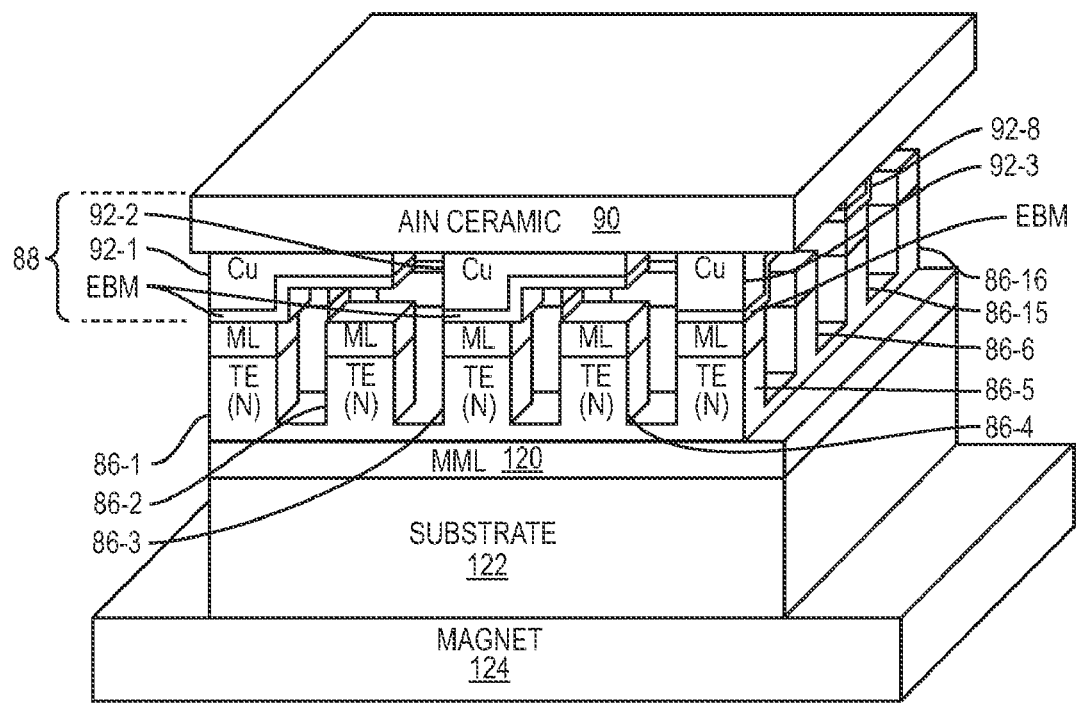
Figure 11I:
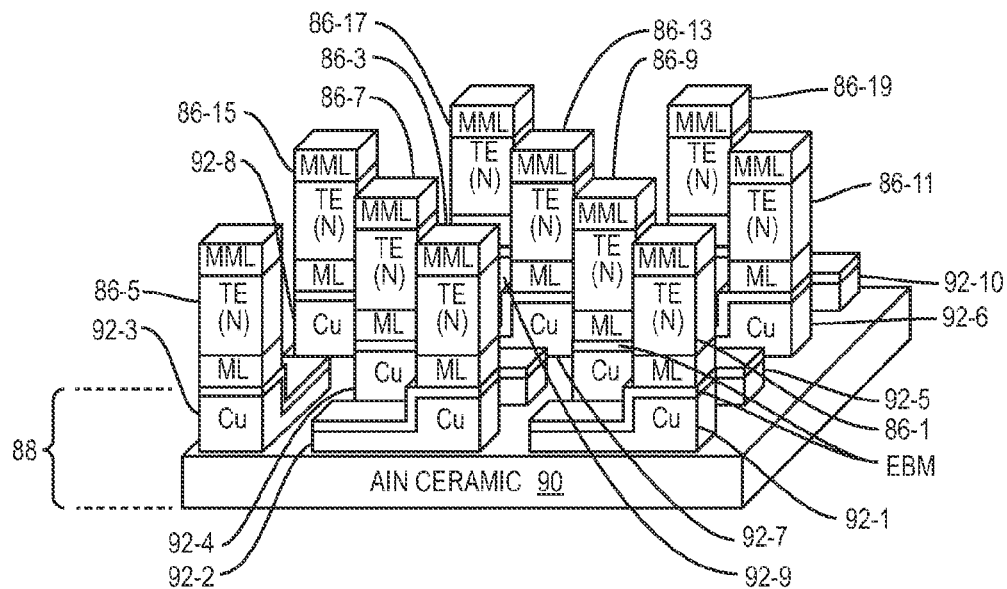
Figure 11J:
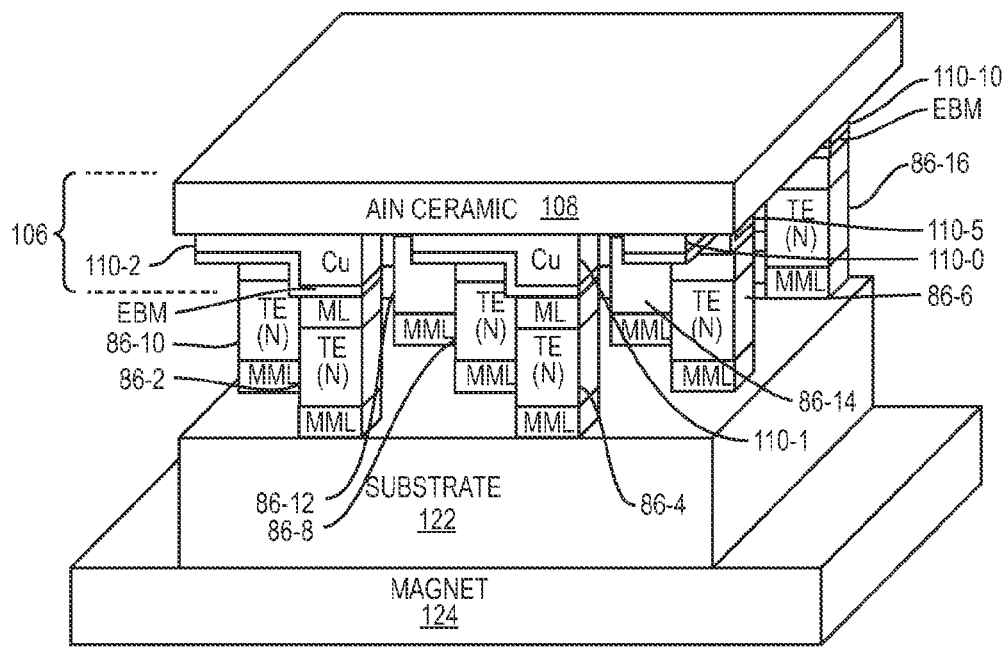
Figure 11K:
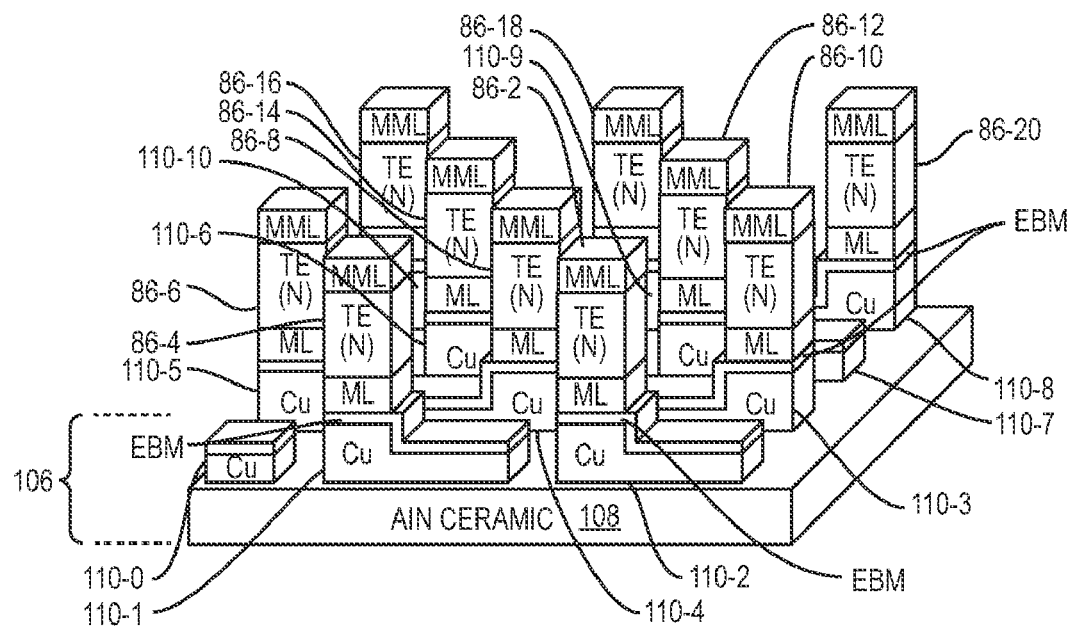
Figure 11L:
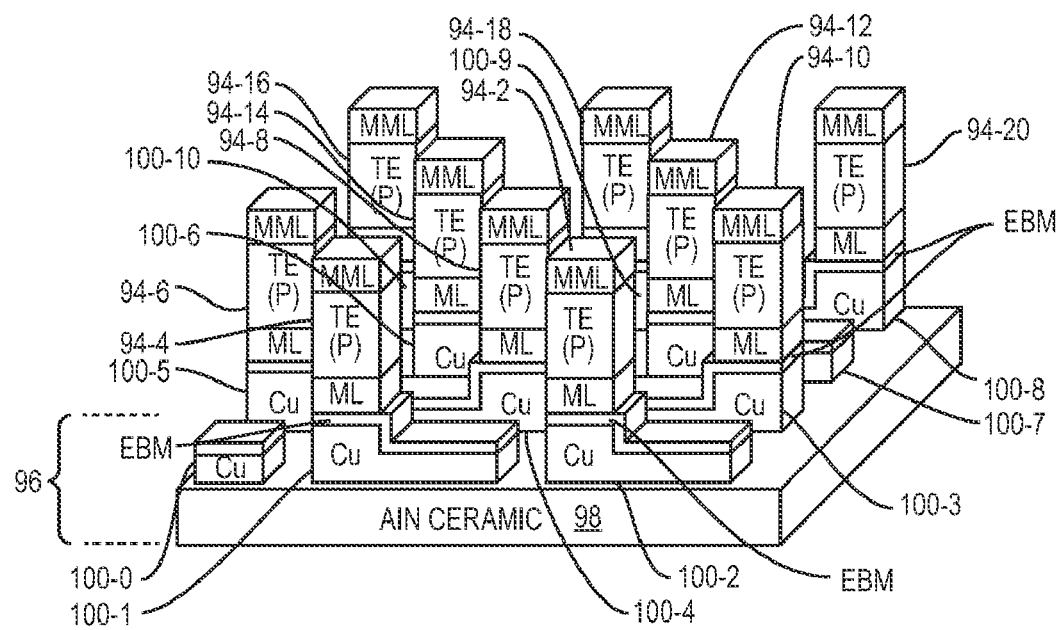
Figure 11M:
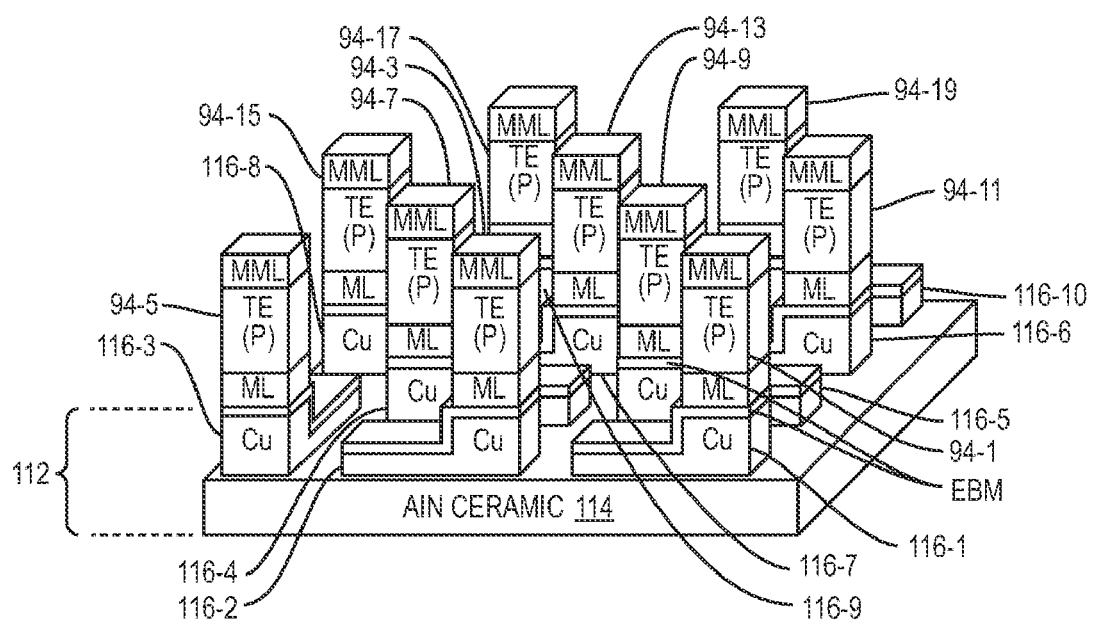
Figure 11N:
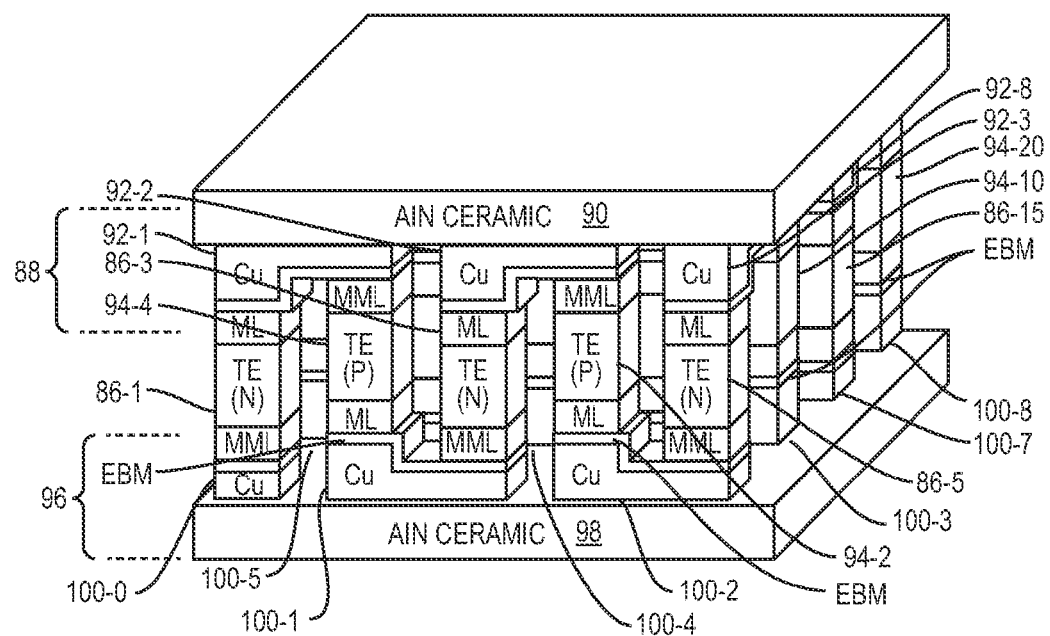
Figure 11O:
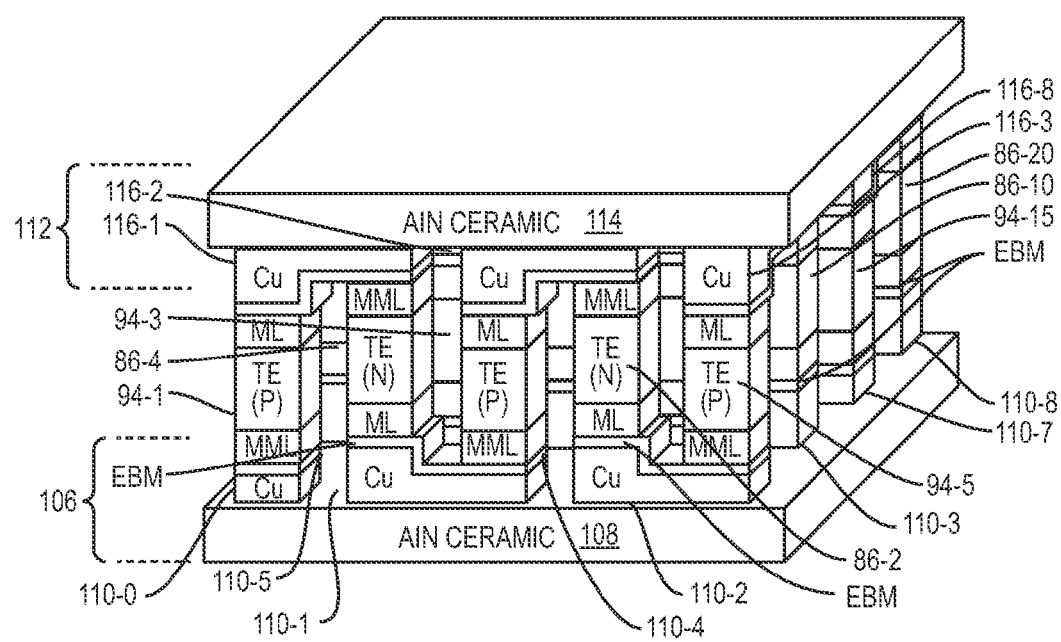

FIG. 4 illustrates a thin film thermoelectric material including a heterostructure formed of IV-VI semiconductor materials, wherein the heterostructure includes multiple potential barrier material layers having thicknesses that are approximately equal to mean free paths of charge carriers for corresponding temperatures in an expected temperature gradient across the thin film thermoelectric material when incorporated into a thermoelectric cooler (TEC) according to one embodiment of the present disclosure;

FIG. 5 is an energy band diagram for the heterostructure of the thin film thermoelectric material of FIG. 4, wherein a Fermi energy of the heterostructure is at or near a barrier height of the potential barrier material layers according to one embodiment of the present disclosure;

FIG. 6 illustrates a thin film thermoelectric material including a heterostructure formed of IV-VI semiconductor materials, wherein the heterostructure includes multiple potential barrier material layers having thicknesses that are approximately equal to mean free paths of charge carriers for corresponding temperatures in an expected temperature gradient across the thin film thermoelectric material when incorporated into a thermoelectric generator (TEG) according to one embodiment of the present disclosure;

FIG. 7 is an energy band diagram for the heterostructure of the thin film thermoelectric material of FIG. 6, wherein a Fermi energy of the heterostructure is at or near a barrier height of the potential barrier material layers according to one embodiment of the present disclosure;

FIG. 8 illustrates a thermoelectric module fabricated to include a number of thermoelectric device couples connected in series according to one embodiment of the present disclosure;

FIGS. 9A through 9K graphically illustrate a process for fabricating the thermoelectric module of FIG. 8 according to one embodiment of the present disclosure;

FIGS. 10A through 10P graphically illustrate a process for fabricating the thermoelectric module of FIG. 8 according to another embodiment of the present disclosure; and FIGS. 11A through 11O graphically illustrate a process for fabricating the thermoelectric module of FIG. 8 according to another embodiment of the present disclosure.

DETAILED DESCRIPTION OF THE PREFERRED EMBODIMENTS

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

Figure 1A:
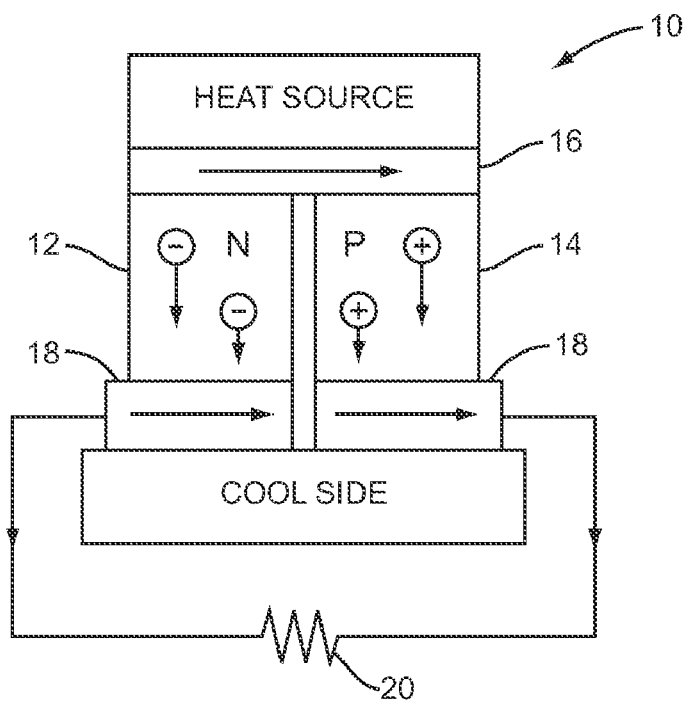
FIGS. 1A and 1B illustrate exemplary thermoelectric devices according to the prior art.
Figure 1B:
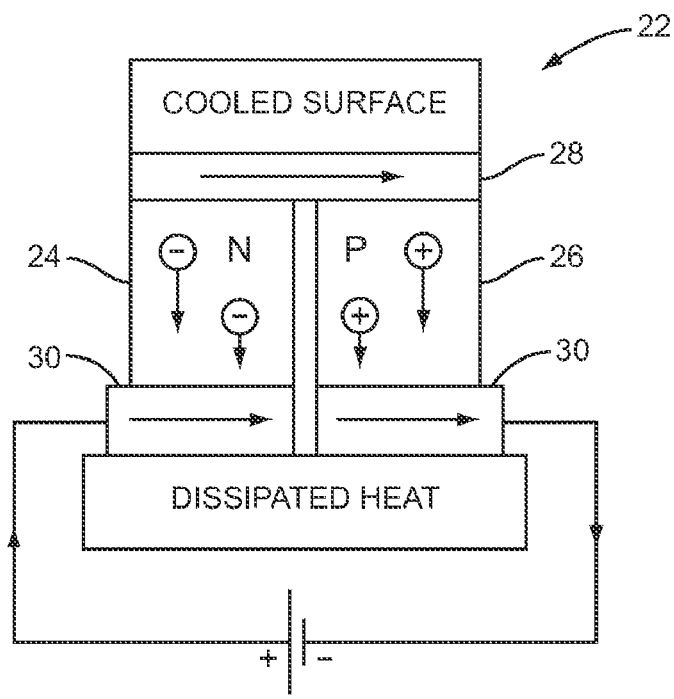
Figure 2:
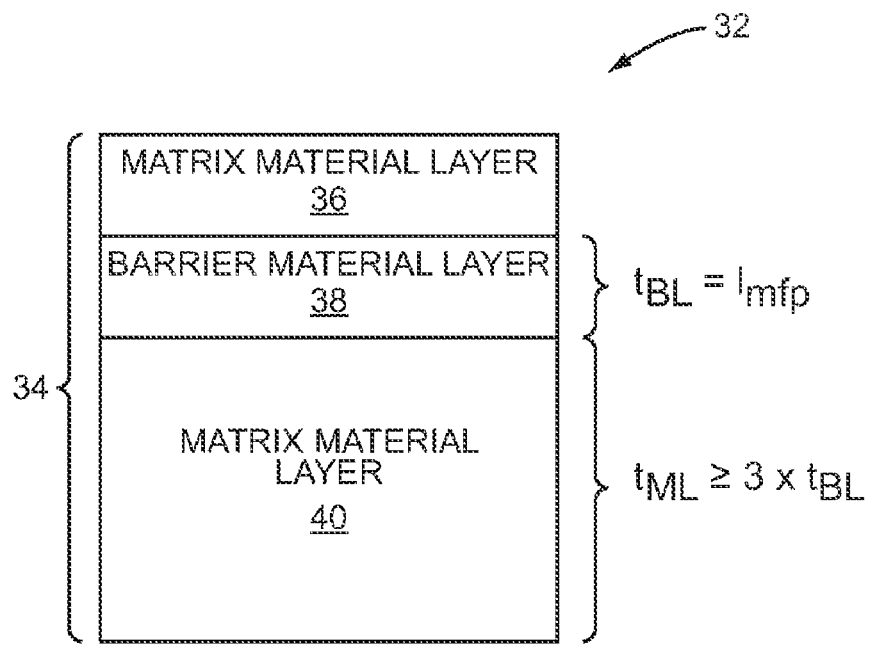
FIG. 2 illustrates a thin film thermoelectric material including a heterostructure formed of IV-VI semiconductor materials, wherein the heterostructure includes a potential barrier material layer having a thickness approximately equal to a mean free path of charge carriers for a desired temperature according to one embodiment of the present disclosure.

FIG. 2 illustrates a thin film thermoelectric material 32 (hereinafter "thermoelectric material 32") having a high ZT value according to one embodiment of the present disclosure. The thermoelectric material 32 includes a heterostructure 34 formed of Group IV-VI semiconductor materials. More specifically, in this embodiment, the heterostructure 34 includes a first matrix material layer 36, a potential barrier material layer 38 (hereinafter "barrier material layer 38") that is adjacent to the first matrix material layer 36, and a second matrix material layer 40 that is adjacent to the barrier material layer 38 opposite the first matrix material layer 36. In order to operate as a potential barrier, the barrier material layer 38 has a bandgap that is greater than a bandgap of the first and second matrix material layers 36 and 40, and is therefore referred to herein as being formed of a wide bandgap material. A resulting barrier height of the barrier material layer 38 is preferably in the range of and including 25 milli-electron-Volts (meV) to 100 meV, but is not limited thereto. In the preferred embodiment, the first and second matrix material layers 36 and 40 are PbSnSe, and the barrier material layer 38 is PbSe. However, other IV-VI semiconductor materials such as, but not limited to, PbTe, PbSnTe, PbSrSe, PbSrTe, and related alloys may be used. For example, in one alternative embodiment, the first and second matrix material layers 36 and 40 are PbSnTe, and the barrier material layer 38 is PbTe. In another alternative embodiment, the first and second matrix material layers 36 and 40 are PbSnSeTe, and the barrier material layer 38 is PbSe. Further, the PbSnSeTe/PbSe combination can be specified as lattice-matched, a feature that will help to improve cross plane charge carrier conduction. In operation, energetic thermally excited electrons, or holes depending on the conductivity type of the thermoelectric material 32, are selectively "skimmed" off and transported from the first matrix material layer 36 across the barrier material layer 38 into the second matrix material layer 40. The first matrix material layer 36 operates as an emitter of charge carriers, and the second matrix material layer 40 operates as a collector of charge carriers.

In this embodiment, a thickness ($t_{BL}$) of the barrier material layer 38 is approximately equal to, or on the order of, a mean free path for charge carriers (i.e., electrons or holes) in the barrier material layer 38 between scattering events at a desired temperature. In one embodiment, the desired temperature is room temperature (i.e., 300 kelvins). However, the desired temperature may be any desired temperature in which a thermoelectric device formed of the thermoelectric material 32 is to be operated. By letting the thickness ($t_{BL}$) of the barrier material layer 38 be approximately equal to the mean free path for charge carriers between scattering events at the desired temperature, ballistic transport of charge carriers from the first matrix material layer 36 through the barrier material layer 38 and into the second matrix material layer 40 is enabled, thereby increasing the Seebeck coefficient of the thermoelectric material 32 and thus the ZT value of the thermoelectric material 32.

If the thermoelectric material 32 is N-type, the mean free path for electrons is defined as:

$$l_{mfp}^e = \frac{\mu_n}{q}\sqrt{3kTm_e^*},\qquad\text{(Eqn. 1)}$$

where $l_{mfp}^e$ is the mean free path for electrons in the barrier material layer 38, $\mu_n$ is the electron mobility of the barrier material layer 38, q is the charge of an electron, k is Boltzmann's constant, T is temperature in kelvins, and $m_e^*$ is electron mass. As such, if the thermoelectric material 32 is N-type, the thickness ($t_{BL}$) of the barrier material layer 38 is preferably defined as:

$$t_{BL} \cong l_{mfp}^e = \frac{\mu_n}{q}\sqrt{3kTm_e^*}.\qquad\text{(Eqn. 2)}$$

Similarly, if the thermoelectric material 32 is P-type, the mean free path for holes is defined as:

$$l_{mfp}^h = \frac{\mu_p}{q}\sqrt{3kTm_h^*},\qquad\text{(Eqn. 3)}$$

where $l_{mfp}^h$ is the mean free path for holes in the barrier material layer 38, $\mu_p$ is the electron mobility of the barrier material layer 38, q is the charge of an electron, k is Boltzmann's constant, T is temperature in kelvins, and $m_h^*$ is hole mass. As such, if the thermoelectric material 32 is P-type, the thickness ($t_{BL}$) of the barrier material layer 38 is preferably defined as:

$$t_{BL} \cong l_{mfp}^h = \frac{\mu_p}{q}\sqrt{3kTm_h^*}.\qquad\text{(Eqn. 4)}$$

As an example, in the preferred embodiment, the barrier material layer 38 is PbSe. For this example, assume that the desired temperature is room temperature (i.e., 300 kelvins). As such, using Equation 2, the mean free path for electrons in lightly doped PbSe at room temperature is 16.9 nanometers (nm) as shown in the following table:

| $N_d$ (cm$^{-3}$) | $\mu_n$ (cm$^2$/vs) | $m_e^*$ (x $m_o$) | $l_{mfp}^e$ (nm) |
|---|---|---|---|
| 1 × 10$^{18}$ | 1,000 | 0.1 | 16.9 |

In a similar manner, using Equation 4, the mean free path for holes in lightly doped PbSe at room temperature is 105 nm as shown in the following table:

| $N_a$ (cm$^{-3}$) | $M_p$ (cm$^2$/vs) | $m_h^*$ (x $m_o$) | $l_{mfp}^h$ (nm) |
|---|---|---|---|
| 2 × 10$^{17}$ | 600 | 0.1 | 10.1 |

Thus, in this example, the thickness of the barrier material layer 38 is approximately 16.9 nm if the thermoelectric material 32 is N-type and approximately 10.1 nm if the thermoelectric material 32 is P-type. Note, however, that the mean free path of charge carriers in PbSe can range from tens of nanometers at high temperatures to hundreds of nanometers at cryogenic temperatures.

In addition, in this embodiment, a thickness ($t_{ML}$) of the second matrix material layer 40 is greater than or equal to three times the thickness of the barrier material layer 38. By letting the thickness ($t_{ML}$) of the second matrix material layer 40 be greater than or equal to three times the thickness ($t_{BL}$) of the barrier material layer 38, charge carriers passing from the first matrix material layer 36 through the barrier material layer 38 and into the second matrix material layer 40 are allowed to relax thermally by scattering at least three times. In other words, the charge carriers are allowed to reach a thermal equilibrium level. Note that the thickness of the first matrix material layer 36 is not relevant with respect to allowing the charge carriers to relax thermally. As such, the thickness of the first matrix material layer 36 may be any desired thickness.

Figure 3:
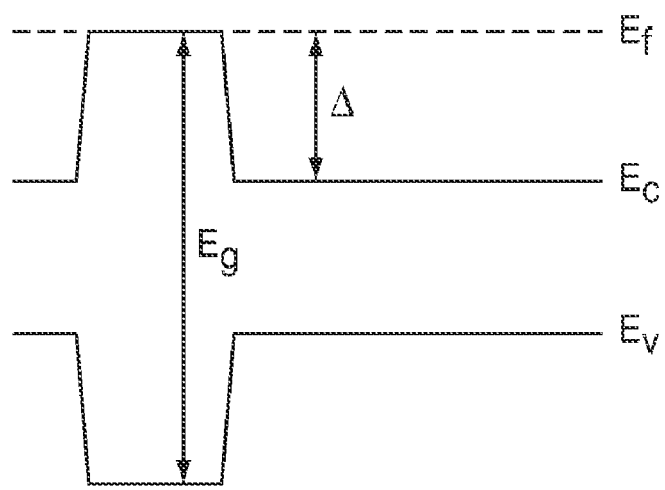
FIG. 3 is an energy band diagram for the heterostructure of the thin film thermoelectric material of FIG. 2, wherein a Fermi energy of the heterostructure is at or near a barrier height of the potential barrier material layer according to one embodiment of the present disclosure.

FIG. 3 is an exemplary energy band diagram for the thermoelectric material 32 of FIG. 2 according to one embodiment of the present disclosure. In this example, the thermoelectric material 32 is N-type. However, this discussion is also applicable for the case where the thermoelectric material 32 is P-type. In this embodiment, alloying of the barrier material layer 38, doping of the first and second matrix material layers 36 and 40, or both is selected or controlled such that a Fermi energy ($E_f$) of the thermoelectric material 32 is at or near a barrier height ($\Delta$) of the barrier material layer 38. Since the Fermi energy ($E_f$) defines an energy level at which the Fermi-Dirac probability distribution function is 0.5 (i.e., the energy level above which half of the charge carriers are expected to reside), by increasing the Fermi energy ($E_f$) such that it is at or near the barrier height ($\Delta$), there are more electrons at or above the barrier height ($\Delta$). As a result, cross-plane effective carrier density is increased, which in turn increases the ZT value for the thermoelectric material 32. The Fermi energy ($E_f$) may be approximately equal to the barrier height ($\Delta$) or within a range of values near the barrier height ($\Delta$).

For example, in the preferred embodiment, the first and second matrix material layers 36 and 40 are PbSe, and the barrier material layer 38 is PbSnSe. The barrier height ($\Delta$) may be controlled via the Sn content. More specifically, increasing the Sn content increases the barrier height ($\Delta$). In addition or alternatively, the Fermi energy ($E_f$) may be controlled via doping of the Group IV-VI semiconductor materials by adding an impurity such as, for example, Bismuth (Bi). Increasing the doping level moves the Fermi energy ($E_f$) more into the conduction band (N-type) or more into the valence band (P-type). The Sn content and/or the doping can be controlled to set the Fermi energy ($E_f$) at or near the barrier height ($\Delta$). In this example, the Fermi energy ($E_f$) may be set approximately equal to the barrier height ($\Delta$), be within a range of the barrier height ($\Delta$) plus or minus approximately 0.1*kT (where k is Boltzmann's constant and T is temperature in kelvins), be within a range of the barrier height ($\Delta$) minus approximately 0.1*kT, or the like. For example, at room temperature with a thermal energy (kT) of 26 meV, the Fermi energy ($E_f$) may be controlled to be the barrier height ($\Delta$)±3 meV.

FIG. 4 illustrates a thin film thermoelectric material 42 (hereinafter "thermoelectric material 42") having a high ZT value according to another embodiment of the present disclosure. The thermoelectric material 42 includes a heterostructure 44 formed of Group IV-VI semiconductor materials. The heterostructure 44 includes an alternating series of matrix material layers 46 and potential barrier material layers 48 (hereinafter "barrier material layers 48"). In order to operate as a potential barrier, the barrier material layers 48 have a bandgap that is greater than a bandgap of the matrix material layers 46, and are therefore referred to herein as being formed of a wide bandgap material. A resulting barrier height of the barrier material layers 48 is preferably in the range of and including 25 meV to 100 meV, but is not limited thereto. In the preferred embodiment, the matrix material layers 46 are PbSnSe, and the barrier material layers 48 are PbSe. However, other Group IV-VI semiconductor materials may be used. In this exemplary embodiment, the heterostructure 44 includes an initial matrix material layer 46-0 and an alternating series of barrier material layers 48-1 through 48-4 and matrix material layers 46-1 through 46-4. Note that in this exemplary embodiment, there are five matrix material layers 46-0 through 46-4, which are generally referred to herein as matrix material layers 46, and four barrier material layers 48-1 through 48-4, which are generally referred to herein as barrier material layers 48. However, the heterostructure 44 is not limited thereto. The heterostructure 44 may include any number of alternating matrix material layers 46 and barrier material layers 48 as long as the heterostructure 44 includes at least two barrier material layers 48.

In this embodiment, the thermoelectric material 42 is designed for operation in a thermoelectric cooler (TEC) such that, during operation, a top surface 50 of the thermoelectric material 42 will be cold and a bottom surface 52 of the thermoelectric material 42 will be hot. As a result, the thermoelectric material 42 will have, or will experience, a corresponding temperature gradient 54. Thicknesses of the barrier material layers 48 are approximately equal to, or on the order of, the mean free paths of charge carriers between scattering events at corresponding temperatures in the temperature gradient 54 for the thermoelectric material 42. By letting the thicknesses of the barrier material layers 48 be approximately equal to the mean free paths for charge carriers between scattering events at the corresponding temperatures in the temperature gradient 54 of the thermoelectric material 42, ballistic transport of charge carriers across the barrier material layers 48 is enabled, thereby increasing the Seebeck coefficient of the thermoelectric material 42.

If the thermoelectric material 42 is N-type, the thickness ($t_{BLi}$) of the ith barrier material layer 48 in the thermoelectric material 42 is preferably defined as:

$$t_{BLi} \cong l_{mfp}^e = \frac{\mu_n}{q}\sqrt{3kT_i m_e^*},\qquad\text{(Eqn. 5)}$$

where $T_i$ is the temperature (in kelvins) in the temperature gradient 54 at a position of the ith barrier material layer 48 in the thermoelectric material 42, $\mu_p$ is the electron mobility of the barrier material layer 48 at temperature $T_i$, q is the charge of an electron, k is Boltzmann's constant, and $m_e^*$ is electron mass. Similarly, if the thermoelectric material 42 is P-type, the thickness ($t_{BLi}$) of the ith barrier material layer 48 in the thermoelectric material 42 is preferably defined as:

$$t_{BLi} \cong l_{mfp}^h = \frac{\mu_p}{q}\sqrt{3kT_i m_h^*},\qquad\text{(Eqn. 6)}$$

where $T_i$ is the temperature (in kelvins) in the temperature gradient 54 at a position of the ith barrier material layer 48 in the thermoelectric material 42, $\mu_p$ is the electron mobility of the barrier material layer 48 at temperature $T_i$, q is the charge of an electron, k is Boltzmann's constant, and $m_h^*$ is hole mass. Depending on the material quality that can be obtained and the absolute temperatures in the thermoelectric material 42, the thicknesses of the barrier material layers 48 designed for high temperatures may be as thin as a few nanometers while barrier material layers 48 designed for low temperatures may be as thick as a 100 nanometers or more.

In addition, in this embodiment, a thickness of each of the matrix material layers 46 that is downstream of an adjacent barrier material layer 48 in the direction of charge carrier flow is greater than or equal to three times the thickness of the immediately preceding barrier material layer 48. More specifically, in this embodiment, the thickness ($t_{ML1}$) of the matrix material layer 46-1 is greater than or equal to three times the thickness ($t_{BL1}$) of the barrier material layer 48-1, the thickness ($t_{ML2}$) of the matrix material layer 46-2 is greater than or equal to three times the thickness ($t_{BL2}$) of the barrier material layer 48-2, the thickness ($t_{ML3}$) of the matrix material layer 46-3 is greater than or equal to three times the thickness ($t_{BL3}$) of the barrier material layer 48-3, and the thickness ($t_{ML4}$) of the matrix material layer 46-4 is greater than or equal to three times the thickness ($t_{BL4}$) of the barrier material layer 48-4. By letting the thicknesses ($t_{ML1}$ through $t_{ML4}$) of the matrix material layers 46-1 through 46-4 be greater than or equal to three times the thicknesses ($t_{BL1}$ through $t_{BL4}$) of the corresponding barrier material layers 48-1 through 48-4, charge carriers are allowed to relax thermally by scattering at least three times after passing through the barrier material layers 48-1 through 48-4. In other words, the charge carriers are allowed to reach a thermal equilibrium level. Note that the thickness of the matrix material layer 46-0 is not relevant with respect to allowing the charge carriers to relax thermally. As such, the thickness of the matrix material layer 46-0 may be any desired thickness.

It should be noted that in one embodiment, incorporation of quantum wells in the collector layers (e.g., the matrix material layers 46-1 through 46-4) can facilitate capture and thermalization of electrons due to electrophonon resonance associated with the subband degeneracy splitting effect. Quantum well incorporation can be useful since it would allow the collector layers to be thinner, thus enabling more barrier material layers 48 with a given device structure thickness. A further benefit is that incorporating periodic quantum well layers will decrease lattice thermal conductivity because of increased phonon scattering associated with Umklapp processes. These as well as other variations and combinations of similar material design concepts are considered within the scope of this disclosure.

FIG. 5 is an exemplary energy band diagram for the thermoelectric material 42 of FIG. 4 according to one embodiment of the present disclosure. In this example, the thermoelectric material 42 is N-type. However, this discussion is also applicable for the case where the thermoelectric material 42 is P-type. In this embodiment, alloying of the barrier material layers 48, doping of the matrix material layers 46, or both is selected or controlled such that a Fermi energy ($E_f$) of the thermoelectric material 42 is at or near a barrier height (A) of the barrier material layers 48. Since the Fermi energy ($E_f$) defines an energy level at which the Fermi-Dirac probability distribution function is 0.5 (i.e., the energy level above which half of the charge carriers are expected to reside), by increasing the Fermi energy ($E_f$) such that it is at or near the barrier height (A), there are more electrons at or above the barrier height (A). As a result, cross-plane effective carrier density is increased, which in turn increases the ZT value for the thermoelectric material 42. The Fermi energy ($E_f$) may be approximately equal to the barrier height (Δ) or within a range of values near the barrier height (Δ). For example, the Fermi energy ($E_f$) may be set approximately equal to the barrier height (Δ), be within a range of the barrier height (Δ) plus or minus approximately 0.1*kT (where k is Boltzmann's constant and T is temperature in kelvins), be within a range of the barrier height (Δ) minus approximately 0.1*kT, or the like.

FIG. 6 illustrates a thin film thermoelectric material 56 (hereinafter "thermoelectric material 56") having a high ZT value according to another embodiment of the present disclosure. This embodiment is substantially the same as that of FIG. 4. However, the thermoelectric material 56 is designed for use in a thermoelectric generator (TEG) rather than a TEC. The thermoelectric material 56 includes a heterostructure 58 formed of Group IV-VI semiconductor materials. The heterostructure 58 includes an alternating series of matrix material layers 60 and potential barrier material layers 62 (hereinafter "barrier material layers 62"). In order to operate as a potential barriers, the barrier material layers 62 have a bandgap that is greater than a bandgap of the matrix material layers 60, and are therefore referred to herein as being formed of a wide bandgap material. A resulting barrier height of the barrier material layers 62 is preferably in the range of and including 25 meV to 100 meV, but is not limited thereto. In the preferred embodiment, the matrix material layers 60 are PbSnSe, and the barrier material layers 62 are PbSe. However, other Group IV-VI semiconductor materials may be used. In this exemplary embodiment, the heterostructure 58 includes an initial matrix material layer 60-0 and an alternating series of barrier material layers 62-1 through 62-4 and matrix material layers 60-1 through 60-4. Note that in this exemplary embodiment, there are five matrix material layers 60-0 through 60-4, which are generally referred to herein as matrix material layers 60, and four barrier material layers 62-1 through 62-4, which are generally referred to herein as barrier material layers 62. However, the heterostructure 58 is not limited thereto. The heterostructure 58 may include any number of alternating matrix material layers 60 and barrier material layers 62 as long as the heterostructure 58 includes at least two barrier material layers 62.

In this embodiment, the thermoelectric material 56 is designed for operation in a TEG such that, during operation, a top surface 64 of the thermoelectric material 56 will be hot and a bottom surface 66 of the thermoelectric material 56 will be cold. As a result, the thermoelectric material 56 will have, or will experience, a corresponding temperature gradient 68. Thicknesses of the barrier material layers 62 are approximately equal to, or on the order of, the mean free paths of charge carriers between scattering events at corresponding temperatures in the temperature gradient 68 for the thermoelectric material 56. By letting the thicknesses of the barrier material layers 62 be approximately equal to the mean free paths for charge carriers between scattering events at the corresponding temperatures in the temperature gradient 68 of the thermoelectric material 56, ballistic transport of charge carriers across the barrier material layers 62 is enabled, thereby increasing the Seebeck coefficient of the thermoelectric material 56.

If the thermoelectric material 56 is N-type, the thickness ($t_{BLi}$) of the ith barrier material layer 62 in the thermoelectric material 56 is preferably defined as:

$$t_{BLi} \cong l_{mfp}^e = \frac{\mu_n}{q}\sqrt{3kT_i m_e^*},\qquad\text{(Eqn. 7)}$$

where $T_i$ is the temperature (in kelvins) in the temperature gradient 68 at a position of the ith barrier material layer 62 in the thermoelectric material 56, $\mu_n$ is the electron mobility of the barrier material layer 62 at temperature $T_i$, q is the charge of an electron, k is Boltzmann's constant, and $m_e^*$ is electron mass. Similarly, if the thermoelectric material 56 is P-type, the thickness ($t_{BLi}$) of the ith barrier material layer 62 in the thermoelectric material 56 is preferably defined as:

$$t_{BLi} \cong l_{mfp}^h = \frac{\mu_p}{q}\sqrt{3kT_i m_h^*},\qquad\text{(Eqn. 8)}$$

where $T_i$ is the temperature (in kelvins) in the temperature gradient 68 at a position of the ith barrier material layer 62 in the thermoelectric material 56, $\mu_p$ is the electron mobility of the barrier material layer 62 at temperature $T_i$, q is the charge of an electron, k is Boltzmann's constant, and $m_h^*$ is hole mass. Depending on the material quality that can be obtained and the absolute temperatures in the thermoelectric material 56, the thicknesses of the barrier material layers 62 designed for high temperatures may be as thin as a few nanometers while barrier material layers 62 designed for low temperatures may be as thick as a 100 nanometers or more.

In addition, in this embodiment, a thickness of each of the matrix material layers 60 that is downstream of an adjacent barrier material layer 62 in the direction of charge carrier flow is greater than or equal to three times the thickness of the immediately preceding barrier material layer 62. More specifically, in this embodiment, the thickness ($t_{ML1}$) of the matrix material layer 60-1 is greater than or equal to three times the thickness ($t_{BL1}$) of the barrier material layer 62-1, the thickness ($t_{ML2}$) of the matrix material layer 60-2 is greater than or equal to three times the thickness ($t_{BL2}$) of the barrier material layer 62-2, the thickness ($t_{ML3}$) of the matrix material layer 60-3 is greater than or equal to three times the thickness ($t_{BL3}$) of the barrier material layer 62-3, and the thickness ($t_{ML4}$) of the matrix material layer 60-4 is greater than or equal to three times the thickness ($t_{BL4}$) of the barrier material layer 62-4. By letting the thicknesses ($t_{ML1}$ through $t_{ML4}$) of the matrix material layers 60-1 through 60-4 be greater than or equal to three times the thicknesses ($t_{BL1}$ through $t_{BL4}$) of the corresponding barrier material layers 62-1 through 62-4, charge carriers are allowed to relax thermally by scattering at least three times after passing through the barrier material layers 62-1 through 62-4. In other words, the charge carriers are allowed to reach a thermal equilibrium level. Note that the thickness of the matrix material layer 60-0 is not relevant with respect to allowing the charge carriers to relax thermally. As such, the thickness of the matrix material layer 60-0 may be any desired thickness.

It should be noted that in one embodiment, incorporation of quantum wells in the collector layers (e.g., the matrix material layers 60-1 through 60-4) can facilitate capture and thermalization of electrons due to electrophonon resonance associated with the subband degeneracy splitting effect. Quantum well incorporation can be useful since it would allow the collector layers to be thinner, thus enabling more barrier material layers 62 with a given device structure thickness. A further benefit is that incorporating periodic quantum well layers will decrease lattice thermal conductivity because of increased phonon scattering associated with Umklapp processes. These as well as other variations and combinations of similar material design concepts are considered within the scope of this disclosure.

FIG. 7 is an exemplary energy band diagram for the thermoelectric material 56 of FIG. 6 according to one embodiment of the present disclosure. In this example, the thermoelectric material 56 is N-type. However, this discussion is also applicable for the case where the thermoelectric material 56 is P-type. In this embodiment, alloying of the barrier material layers 62, doping of the matrix material layers 60, or both is selected or controlled such that a Fermi energy ($E_f$) of the thermoelectric material 56 is at or near a barrier height ($\Delta$) of the barrier material layers 62. Since the Fermi energy ($E_f$) defines an energy level at which the Fermi-Dirac probability distribution function is 0.5 (i.e., the energy level above which half of the charge carriers are expected to reside), by increasing the Fermi energy ($E_f$) such that it is at or near the barrier height (A), there are more electrons at or above the barrier height ($\Delta$). As a result, cross-plane effective carrier density is increased, which in turn increases the ZT value for the thermoelectric material 56. The Fermi energy ($E_f$) may be approximately equal to the barrier height (A) or within a range of values near the barrier height ($\Delta$). For example, the Fermi energy ($E_f$) may be set approximately equal to the barrier height ($\Delta$), be within a range of the barrier height ($\Delta$) plus or minus approximately 0.1*kT (where k is Boltzmann's constant and T is temperature in kelvins), be within a range of the barrier height (A) minus approximately 0.1*kT, or the like.

FIG. 8 illustrates a thermoelectric module 70 that includes a number of thin film thermoelectric devices 72-1 through 72-10 (generally thermoelectric devices 72) connected in series in a serpentine configuration according to one embodiment of the present disclosure. Preferably, the thermoelectric devices 72 are formed of the thermoelectric material 32, 42, or 56 described above. As illustrated, when configured as a TEG, heat is applied to a top surface of the thermoelectric module 70 (not shown so that the serpentine configuration of the thermoelectric devices 72 can be seen) such that a heat differential is created between the top surface of the thermoelectric module 70 and a bottom surface 74 of the thermoelectric module 70. As a result, a current is created in the thermoelectric module 70 that flows through the thermoelectric devices 72 in a serpentine path as illustrated (i.e., through thermoelectric device 72-1, to thermoelectric device 72-2, to thermoelectric device 72-3, to thermoelectric device 72-4, and so on). In contrast, when configured as a TEC, a current is applied to the thermoelectric module 70 such that the current flows through the thermoelectric devices 72 in the illustrated serpentine path. As a result, the top surface of the thermoelectric module 70 is cooled.

Figure 9A:
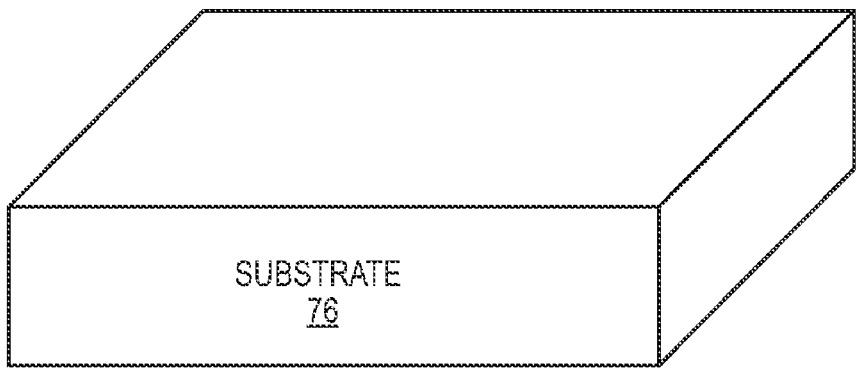
Figure 9B:
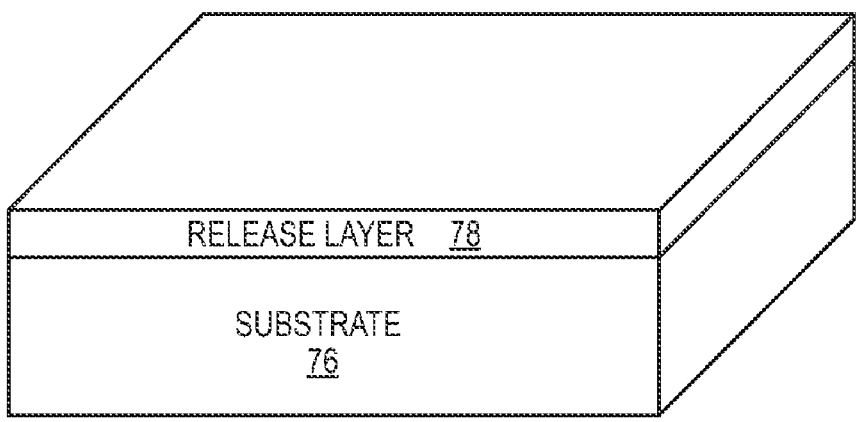

FIGS. 9A through 9J graphically illustrate a process for fabricating the thermoelectric module 70 of FIG. 8 according to one embodiment of the present disclosure. The process starts with a substrate 76, as illustrated in FIG. 9A. In one embodiment, the substrate 76 is a Silicon (Si) substrate. However, the present disclosure is not limited thereto. Other types of substrates such as for example Sapphire substrates, may be used. Next, as illustrated in FIG. 9B, a release layer 78 is formed on the substrate 76. In one embodiment, the release layer 78 is Barium Fluoride ($BaF_2$), which is easily dissolvable in water. Note, however, that other types of release layers may be used to allow structures formed on the substrate 76 to separate from the substrate 76.

Figure 9C:
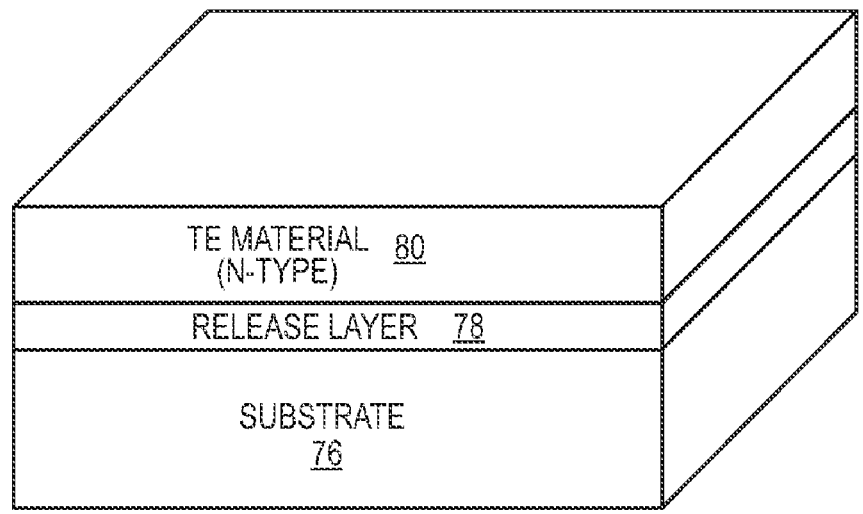
Figure 9D:
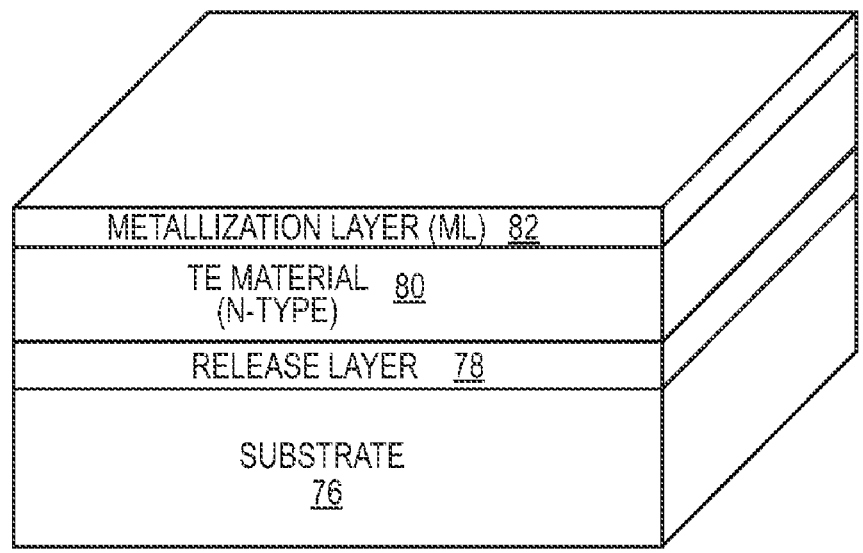

Next, an N-type thermoelectric material layer 80 is formed on the release layer 78 as illustrated in FIG. 9C. Preferably, the N-type thermoelectric material layer 80 is formed of the thermoelectric material 32, 42, or 56 described above. However, the present disclosure is not limited thereto. Other types of thin film thermoelectric materials may be used. The N-type thermoelectric material layer 80 is formed using known thin film fabrication techniques such as molecular beam epitaxy (MBE), liquid phase epitaxy (LPE), or metal organic chemical vapor deposition (MOCVD). In one embodiment, the N-type thermoelectric material layer 80 has a thickness in a range of and including 5 micrometers (μm) to 25 μm. A metallization layer (ML) 82 is then formed on the N-type thermoelectric material layer 80, as illustrated in FIG. 9D. The metallization layer 82 serves multiple functions and therefore may be comprised of one or more different materials, or sub-layers. Preferably, the metallization layer 82 includes an ohmic contact sub-layer adjacent to the N-type thermoelectric material layer 80 to achieve a low specific contact resistance, a diffusion barrier sub-layer to prevent migration of atomic species into the N-type thermoelectric material layer 80, a eutectic bonding metal for low temperature attachment to another metal, and an oxidation barrier sub-layer such as Gold. The thickness of the metallization layer 82 is preferably in the range of and including 1.0 to 5.0 microns. The metallization layer 82 is formed via a blanket metallization process such as, for example, electron beam deposition or electroplating. The metallization layer 82 preferably includes materials having high electrical and thermal conductivities. For example, Copper or Silver may be used.

Figure 9E:
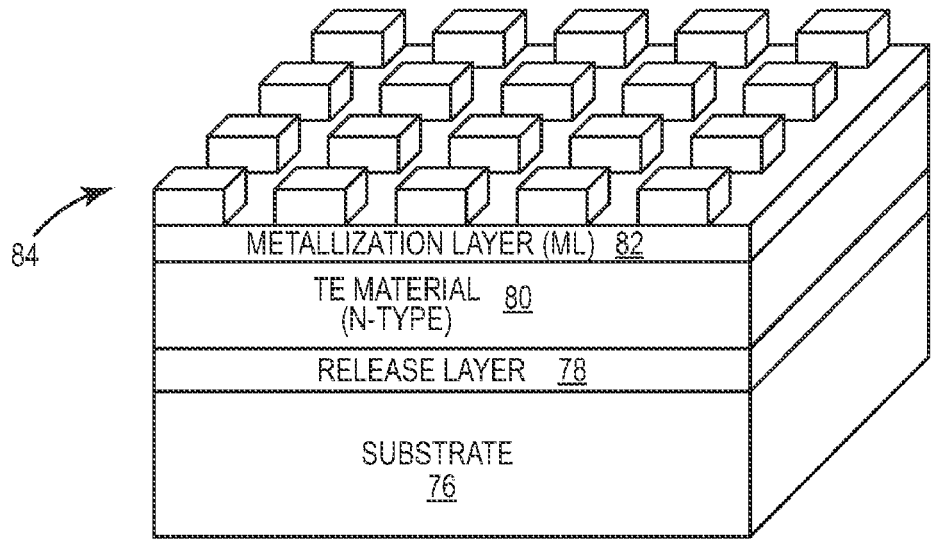
Figure 9F:
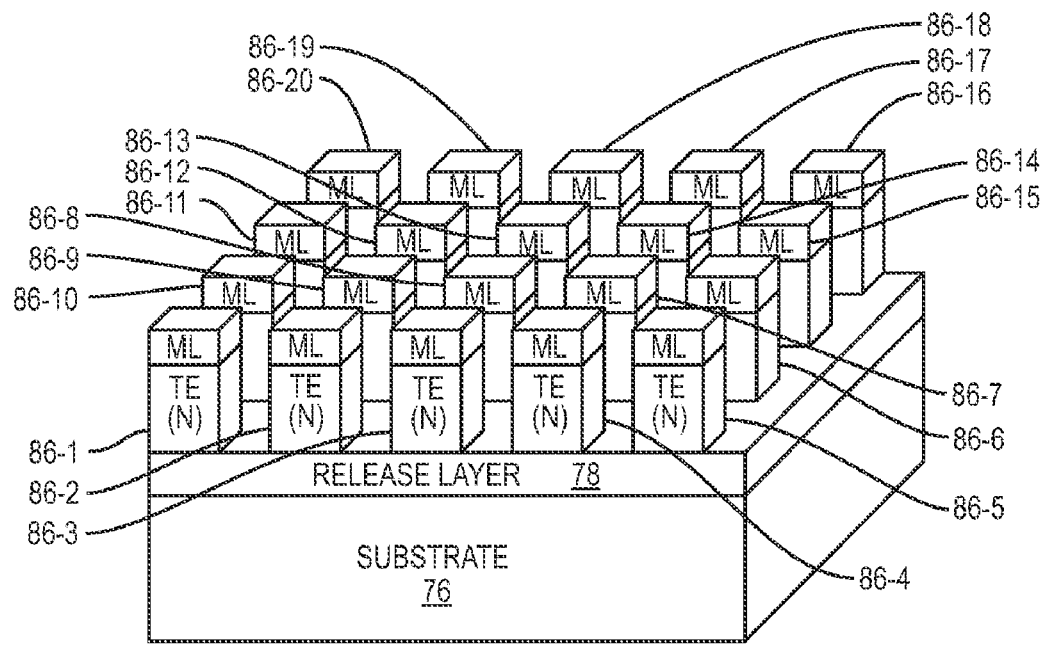

Next, a photoresist layer 84 is deposited and patterned as illustrated in FIG. 9E. The metallization layer 82 and the N-type thermoelectric material layer 80 are then etched completely through the N-type thermoelectric material layer 80 down to the release layer 78 in the regions of the removed photoresist layer 84 to form a number of N-type thermoelectric material legs 86-1 through 86-20 (generally referred to herein as N-type thermoelectric material legs 86), as illustrated in FIG. 9F. A combination of wet chemical and dry plasma etching or dry plasma etching alone can be used. Note that while twenty N-type thermoelectric material legs 86 are illustrated, there may be any desired number of one or more N-type thermoelectric material legs 86. Each of the N-type thermoelectric material legs 86 includes a corresponding portion of the N-type thermoelectric material layer 80 and the metallization layer 82.

Figure 9G:
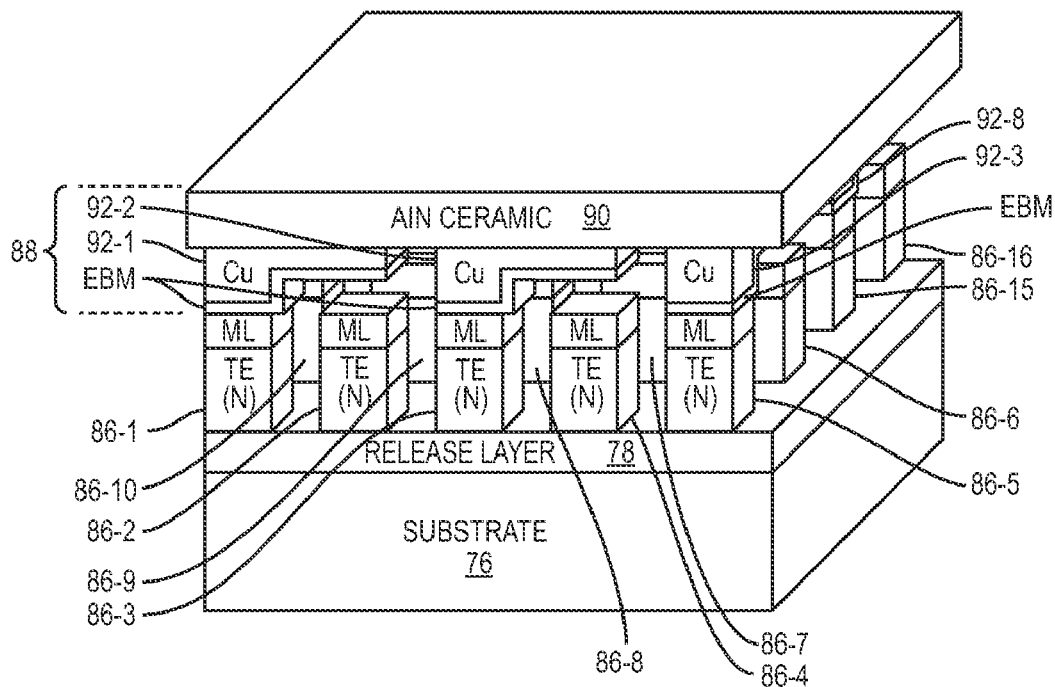

Next, a first electrode assembly 88 is bonded to a first portion of the N-type thermoelectric material legs 86 as illustrated in FIG. 9G. The first electrode assembly 88 includes an Aluminum Nitride (AlN) ceramic 90 and a number of Copper traces 92-1 through 92-10 (only 92-1 through 92-3 are visible in FIG. 9G). Again, Copper is exemplary. Other materials having high electrical and thermal conductivity may be used. For example, Silver may alternatively be used. In this embodiment, the Copper traces 92-1 through 92-10 (generally referred to herein as Copper traces 92) are metalized with a eutectic bonding material (EBM) such as, for example, Gold-Tin, Lead-Tin, Gold-Indium, Indium, or the like. The eutectic bonding material preferably has a thickness in the range of and including 0.5 to 5.0 microns. The eutectic bonding material is a low melting temperature material that requires significantly less pressure for bonding when liquid than, for example, Copper-to-Copper diffusion bonding. As a result, the chance of the N-type thermoelectric material being damaged as a result of pressure during bonding is substantially reduced. The bonding step is preferably performed in a vacuum environment to prevent formation of unwanted oxides. Note, however, that the present disclosure is not limited to eutectic bonding. It should also be noted that AlN is exemplary. Any material having low electrical conductivity and high thermal conductivity may be used (e.g., diamond, Beryllium Oxide, Alumina, or the like).

In this embodiment, the Copper traces 92 are "L" shaped. In one embodiment, at their thickest point, the "L" shaped Copper traces 92 have a thickness in a range of and including 2 μm to 5 μm and, at their thinnest point, the "L" shaped Copper traces 92 have a thickness in a range of and including 1 μm to 2 μm. Multiple deposition steps using physical vapor or electrochemical deposition methods can be used to form the "L" shaped traces. Additive techniques involving use of shadow masks or subtractive techniques involving photolithographic masks and chemical etching can be used. Preferably, the Copper traces 92 will be coated with a eutectic bonding metal for facilitating low temperature attachment to the metallized TE leg segments. The N-type thermoelectric material legs 86-1, 86-3, 86-5, 86-7, 86-9, 86-11, 86-13, 86-15, 86-17, and 86-19 are bonded to the Copper traces 92-1 through 92-10, respectively. The thin portions of the "L" shaped Copper traces 92 are locations at which P-type thermoelectric material legs will subsequently be bonded to complete fabrication of the thermoelectric module 70.

Figure 9H:
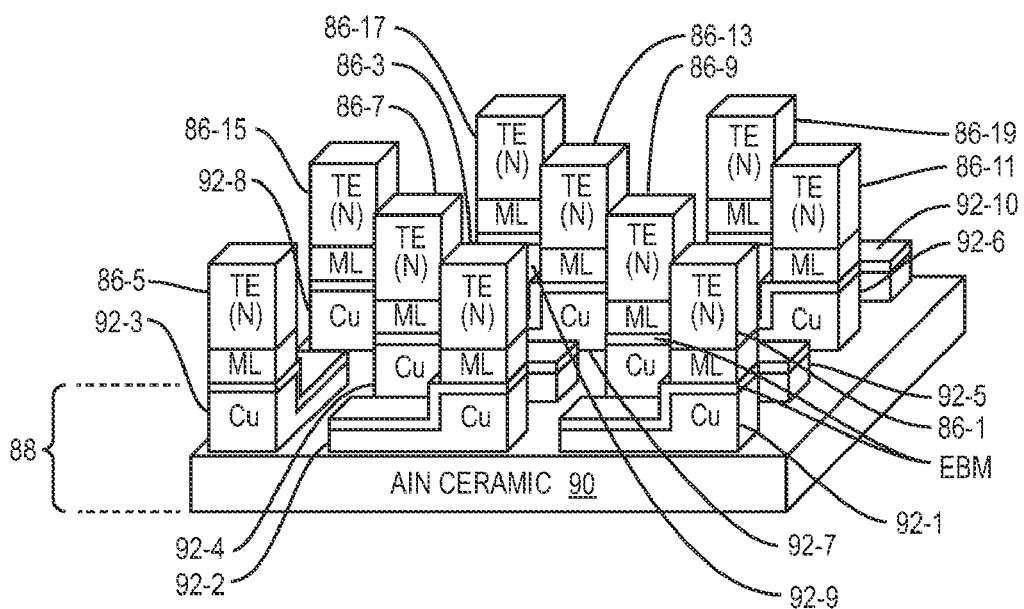
Figure 9I:
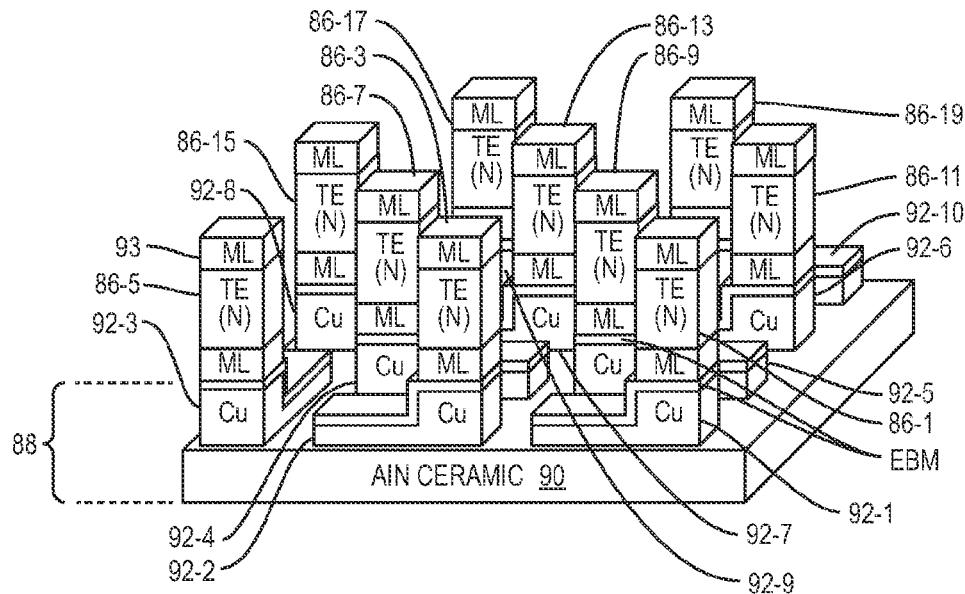

At this point, the release layer 78 is dissolved such that the N-type thermoelectric material legs 86 are released from the substrate 76. In one embodiment, the release layer 78 is Barium Fluoride ($BaF_2$) and is dissolved in water. The first electrode assembly 88 is then lifted from the substrate 76 as illustrated in FIG. 9H. The exposed N-type thermoelectric material surfaces of the N-type thermoelectric material legs 86 are then metalized with a metallization layer 93 as illustrated in FIG. 9I. Preferably, the metallization layer 93 includes an ohmic contact sub-layer adjacent to the N-type thermoelectric material to achieve a low specific contact resistance, a diffusion barrier sub-layer to prevent migration of atomic species into the N-type thermoelectric material, a eutectic bonding metal for low temperature attachment to another metal, and an oxidation barrier sub-layer such as Gold. The metallization layer 93 on the surface of each of the N-type thermoelectric material legs 86 can be formed by a direct line-of-sight physical vapor deposition technique such as electron beam evaporation such that the metallization layer 93 does not coat the sidewalls of the N-type thermoelectric material legs 86. If necessary, the sidewalls of the N-type thermoelectric material legs 86 can be coated with photoresist for protection from metal deposition. Standard metallization lift-off techniques familiar to those skilled in the art can then be used to obtain electrode assembly structures where the metallization layer 93 covers only the top surfaces of the N-type thermoelectric material legs 86.

Figure 9J:
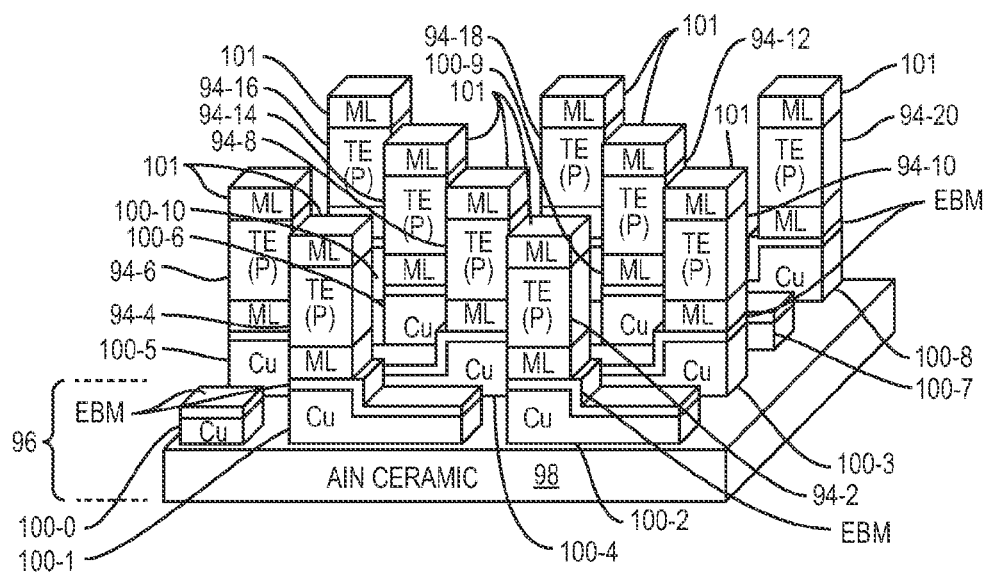

The process of FIGS. 9A through 9I is also performed for P-type thermoelectric material in order to form P-type thermoelectric material legs 94 bonded to a second electrode assembly 96, as illustrated in FIG. 9J. Like the first electrode assembly 88, the second electrode assembly 96 includes an AlN ceramic 98 and a number of Copper traces 100-1 through 100-10 (generally referred to herein as Copper traces 100). The Copper traces 100-1 through 100-10 are bonded to a corresponding portion of the P-type thermoelectric material legs 94, namely, the P-type thermoelectric material legs 94-2, 94-4, 94-6, 94-8, 94-10, 94-12, 94-14, 94-16, 94-18, and 94-20. Note that the second electrode assembly includes a Copper trace 100-0 that has a thinner portion, a position at which a corresponding P-type thermoelectric material leg 94 is to be bonded.

Again, after removing the second electrode assembly 96 including the P-type thermoelectric material legs 94 from a corresponding substrate, the exposed P-type thermoelectric material surfaces of the P-type thermoelectric material legs 96 are metalized with a metallization layer 101, as is also illustrated in FIG. 9J. Preferably, the metallization layer 101 includes an ohmic contact sub-layer adjacent to the P-type thermoelectric material to achieve a low specific contact resistance, a diffusion barrier sub-layer to prevent migration of atomic species into the P-type thermoelectric material, a eutectic bonding metal for low temperature attachment to another metal, and an oxidation barrier sub-layer such as Gold. The eutectic bonding metal used here will preferably have a lower liquidus temperature than the eutectic bonding metal on the other side of the TE leg material. For example, a AuIn eutectic bonding metal can be used without allowing a higher liquidus temperature AuSn bonding metal to become liquid on the other side of the TE leg. The metallization layer 101 on the surface of each of the P-type thermoelectric material legs 94 can be formed by a direct line-of-sight physical vapor deposition technique such as electron beam evaporation such that the metallization layer 101 does not coat the sidewalls of the P-type thermoelectric material legs 94. If necessary, the sidewalls of the P-type thermoelectric material legs 94 can be coated with photoresist for protection from metal deposition. Standard metallization lift-off techniques familiar to those skilled in the art can then be used to obtain electrode assembly structures where the metallization layer 101 covers only the top surfaces of the P-type thermoelectric material legs 94.

Figure 9K:
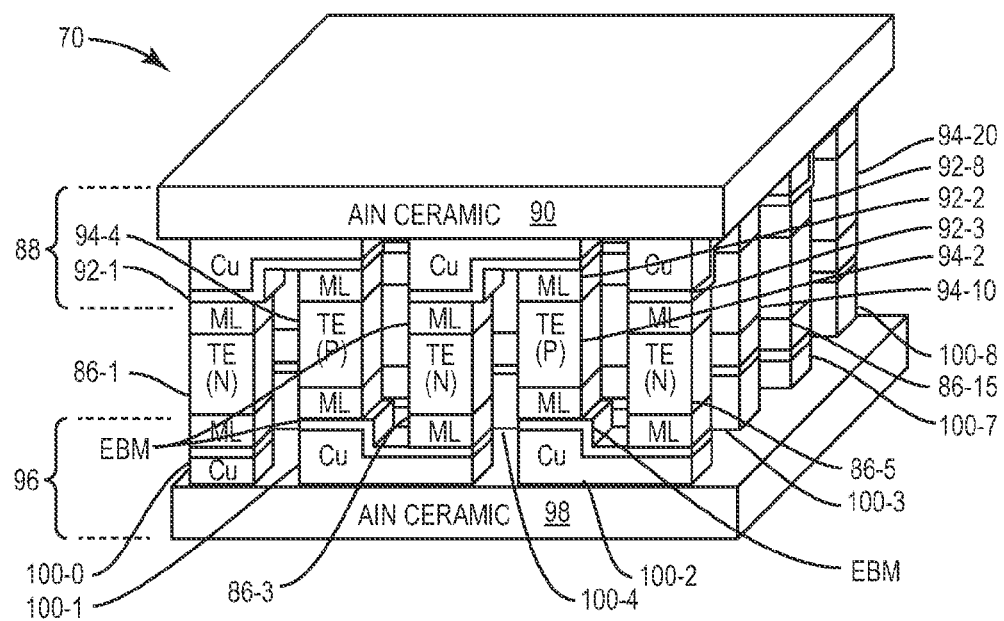

Lastly, the first electrode assembly 88 of FIG. 9I is bonded to the second electrode assembly 96 of FIG. 9J using a flip-chip bonding process as illustrated in FIG. 9K. The bonding temperature will be high enough to liquefy the eutectic bonding metal but below the liquidus temperature of the previously used eutectic bonding metal on the other side of the TE material. At this point, fabrication of the thermoelectric module 70 is complete. Specifically, the N-type thermoelectric material leg 86-1 and the P-type thermoelectric material leg 94-2 form a first thermoelectric device, the N-type thermoelectric material leg 86-3 and the P-type thermoelectric material leg 94-4 form a second thermoelectric device coupled in series with the first thermoelectric device, and so on.

FIGS. 10A through 10P illustrate fabrication of the thermoelectric module 70 of FIG. 8 according to another embodiment of the present disclosure. Many aspects of this process are the same as that described above. Again, the process starts with the substrate 76, as illustrated in FIG. 10A. Next, as illustrated in FIG. 10B, the release layer 78 is formed on the substrate 76. Next, the N-type thermoelectric material layer 80 is formed on the release layer 78 as illustrated in FIG. 10C. A magnetic metallization layer (MML) 102 is then formed on the N-type thermoelectric material layer 80, as illustrated in FIG. 10D. In this embodiment, the magnetic metallization layer 102 is substantially the same as the metallization layer 82 of FIG. 9D described above but further includes a magnetic material. In one preferred embodiment, the magnetic metallization layer 102 includes a sub-layer of a magnetic material such as Cobalt (Co). The Cobalt sub-layer is preferably 50 nanometers (nm) to 300 nm thick. Note that other types of magnetic materials that have high electrical and thermal conductivity may be used. The sub-layer of magnetic material, such as Cobalt (Co), may be positioned at any desired location within the sub-layers of the magnetic metallization layer 102. For instance, the sub-layer of magnetic material may be the first sub-layer of the magnetic metallization layer 102 adjacent to the N-type thermoelectric material layer 80, an upper most sub-layer of the magnetic metallization layer 102, or any sub-layer in between the top and bottom surface of the magnetic metallization layer 102. The magnetic metallization layer 102 is formed via a blanket metallization process such as, for example, PVD or electroplating.

Next, the photoresist layer 84 is deposited and patterned as illustrated in FIG. 10E. The magnetic metallization layer 102 and the N-type thermoelectric material layer 80 are then etched down completely through the N-type thermoelectric material layer 80 to the release layer 78 in the removed regions of the patterned photoresist layer 84 to form the N-type thermoelectric material legs 86, as illustrated in FIG. 10F. Each of the N-type thermoelectric material legs 86 includes a corresponding portion of the N-type thermoelectric material layer 80 and the magnetic metallization layer 102. Next, the first electrode assembly 88 is bonded to the first portion of the N-type thermoelectric material legs 86 as illustrated in FIG. 10G. Again, in this embodiment, the Copper traces 92 are metalized with the eutectic bonding material such as, for example, Gold-Tin, Lead-Tin, Gold-Indium, Indium, or the like.

At this point, a magnet 104 is placed under the substrate 76 opposite the N-type thermoelectric material legs 86. The release layer 78 is then dissolved. The first electrode assembly 88 is then lifted from the substrate 76 as illustrated in FIG. 10H. The exposed N-type thermoelectric material surfaces of the N-type thermoelectric material legs 86 are then metalized with the metallization layer 93 as illustrated in FIG. 10I. Preferably, the metallization layer 93 includes an ohmic contact sub-layer adjacent to the N-type thermoelectric material to achieve a low specific contact resistance, a diffusion barrier sub-layer to prevent migration of atomic species into the N-type thermoelectric material, a eutectic bonding metal for low temperature attachment to another metal, and an oxidation barrier sub-layer such as Gold. The eutectic bonding metal used here will preferably have a lower liquidus temperature than the eutectic bonding metal on the other side of the TE leg material. For example, a AuIn eutectic bonding metal can be used without allowing a higher liquidus temperature AuSn bonding metal to become liquid on the other side of the TE leg. The metallization layer 93 on the surface of each of the N-type thermoelectric material legs 86 can be formed by a direct line-of-sight physical vapor deposition technique such as electron beam evaporation such that the metallization layer 93 does not coat the sidewalls of the N-type thermoelectric material legs 86. If necessary, the sidewalls of the N-type thermoelectric material legs 86 can be coated with photoresist for protection from metal deposition. Standard metallization lift-off techniques familiar to those skilled in the art can then be used to obtain electrode assembly structures where the metallization layer 93 covers only the top surfaces of the N-type thermoelectric material legs 86.

Due to the magnetic force between the magnet 104 and the magnetic metallization layer portion of the N-type thermoelectric material legs 86, the N-type thermoelectric material legs 86 that are not bonded to the first electrode assembly 88 remain on the substrate 76 after the release layer 78 is dissolved. Without the magnetic force, the unharvested N-type thermoelectric material legs 86 (i.e., the N-type thermoelectric material legs 86 that are not bonded to the first electrode assembly 88) are lost when the release layer 78 is dissolved. Thus, yield can be increased from 50% to 100%.

Because the remaining portion of the N-type thermoelectric material legs 86 remain on the substrate 76 due to the magnetic force, in this embodiment, the remaining portion of the N-type thermoelectric material legs 86 can be harvested by bonding a third electrode assembly 106 to the remaining portion of the N-type thermoelectric material legs 86 as illustrated in FIG. 10J. The third electrode assembly 106 includes an AlN ceramic 108 and a number of Copper traces 110-1 through 110-10 (only 110-1 and 110-2 are visible in FIG. 10J), which are generally referred to herein as Copper traces 110. Note that there is also a Copper trace 110-0 that is not "L" shaped defining a position at which a P-type thermoelectric material leg 94 is to be bonded. Again, Copper is exemplary. Other materials having high electrical and thermal conductivity may be used. For example, Silver may alternatively be used. In this embodiment, the Copper traces 110 are metalized with a eutectic bonding material (EBM) such as, for example, Gold-Tin, Lead-Tin, Gold-Indium, Indium, or the like. The eutectic bonding material preferably has a thickness in the range of and including 0.5 to 5.0 microns. The eutectic bonding material is a low melting temperature material that requires significantly less pressure for bonding when liquid than, for example, Copper-to-Copper diffusion bonding. As a result, the chance of the N-type thermoelectric material being damaged as a result of pressure during bonding is substantially reduced. The bonding step is preferably performed in a vacuum environment to prevent formation of unwanted oxides. Note, however, that the present disclosure is not limited to eutectic bonding It should also be noted that AlN is exemplary. Any material having low electrical conductivity and high thermal conductivity may be used (e.g., diamond, Beryllium Oxide, Alumina, or the like).

In this embodiment, the Copper traces 110 are "L" shaped. In one embodiment, at their thickest point, the "L" shaped Copper traces 110 have a thickness in a range of and including 2 μm to 5 μm and, at their thinnest point, the "L" shaped Copper traces 110 have a thickness in a range of and including 1 μm to 2 μm. Multiple deposition steps using physical vapor or electrochemical deposition methods can be used to form the "L" shaped traces. Additive techniques involving use of shadow masks or subtractive techniques involving photolithographic masks and chemical etching can be used. Preferably, the Copper traces 110 will be coated with a eutectic bonding metal for facilitating low temperature attachment to the metallized TE leg segments. The N-type thermoelectric material legs 86-2, 86-4, 86-6, 86-8, 86-10, 86-12, 86-14, 86-16, 86-18, and 86-20 are bonded to the Copper traces 110-1 through 110-10, respectively. The thin portions of the "L" shaped Copper traces 110 are locations at which P-type thermoelectric material legs will subsequently be bonded to complete fabrication of the thermoelectric module 70.

The third electrode assembly 106, including the N-type thermoelectric material legs 86, is then lifted from the substrate 76 as illustrated in FIG. 10K. Note that the magnet 104 may be moved away from the substrate 76 (or vice versa) in order to release the remaining portion of the N-type thermoelectric material legs 86 from the substrate 76. Again, the exposed N-type thermoelectric material surfaces of the N-type thermoelectric material legs 86 are then metalized with the metallization layer 93 as illustrated in FIG. 10L in the manner described above.

The process of FIGS. 10A through 10L is also performed for P-type thermoelectric material in order to form the P-type thermoelectric material legs 94 bonded to the second electrode assembly 96 and a fourth electrode assembly 112, as illustrated in FIGS. 10M and 10N, respectively. Like the other electrode assemblies, the fourth electrode assembly 112 includes an AlN ceramic 114 and a number of Copper traces 116-1 through 116-10 (generally referred to herein as Copper traces 116). The Copper traces 100-1 through 100-10 of the second electrode assembly 96 are bonded to a corresponding portion of the P-type thermoelectric material legs 94, namely, the P-type thermoelectric material legs 94-2, 94-4, 94-6, 94-8, 94-10, 94-12, 94-14, 94-16, 94-18, and 94-20. Likewise, the Copper traces 116-1 through 116-10 of the fourth electrode assembly 112 are bonded to the remaining portion of the P-type thermoelectric material legs 94, namely, the P-type thermoelectric material legs 94-1, 94-3, 94-5, 94-7, 94-9, 94-11, 94-13, 94-15, 94-17, and 94-19.

Lastly, the first electrode assembly 88 of FIG. 10I is bonded to the second electrode assembly 96 of FIG. 10M using a flip-chip bonding process as illustrated in FIG. 10O. The bonding temperature will be high enough to liquefy the eutectic bonding metal but below the liquidus temperature of the previously used eutectic bonding metal on the other side of the TE material. At this point, fabrication of the thermoelectric module 70 is complete. In the same manner, the third electrode assembly 106 of FIG. 10L and the fourth electrode assembly 112 of FIG. 10N are bonded together using a flip-chip bonding process to fabricate a second thermoelectric module 118 as illustrated in FIG. 10P.

FIGS. 11A through 11O illustrate fabrication of the thermoelectric module 70 of FIG. 8 according to another embodiment of the present disclosure. Many aspects of this process are the same as that described above. Again, the process starts with the substrate 76, as illustrated in FIG. 11A. Next, as illustrated in FIG. 11B, the release layer 78 is formed on the substrate 76. Next, the N-type thermoelectric material layer 80 is formed on the release layer 78 as illustrated in FIG. 11C. The metallization layer 82 is then formed on the N-type thermoelectric material layer 80, as illustrated in FIG. 10D. Next, the photoresist layer 84 is deposited and patterned as illustrated in FIG. 11E.

The metallization layer 82 and the N-type thermoelectric material layer 80 are then etched down to a predetermined thickness (t) from a bottom of the N-type thermoelectric material layer 80, which in this embodiment is the predetermined thickness (t) from the release layer 78, through the removed portions of the patterned photoresist layer 84 to form the N-type thermoelectric material legs 86, as illustrated in FIG. 11F. Each of the N-type thermoelectric material legs 86 includes a corresponding portion of the N-type thermoelectric material layer 80 and the metallization layer 82. In one embodiment, the predetermined thickness (t) may be, for example, 0.5 μm to 2 μm. In another embodiment, the predetermined thickness is 10% to 20% of the thickness of the N-type thermoelectric material layer 80. As discussed below, by not etching all the way through the N-type thermoelectric material layer 80, the bottom surface of the N-type thermoelectric material layer 80 is a continuous surface that is suitable for blanket metallization.

Next, the release layer 78 is dissolved to remove the N-type thermoelectric material legs 86 from the substrate 76, and blanket metallization is performed to form a magnetic metallization layer 120 on the continuous bottom surface of the N-type thermoelectric material legs 86 as illustrated in FIG. 11G. The magnetic metallization layer 120 preferably includes a number of sub-layers including a sub-layer of magnetic material such as Cobalt (Co). In one embodiment, the magnetic metallization layer 120 includes a Cobalt (Co) sub-layer, where the Cobalt (Co) sub-layer has a thickness in the range of and including 50 nm to 300 nm. The magnetic metallization layer 120 may also include an ohmic contact sub-layer adjacent to the N-type thermoelectric material to achieve a low specific contact resistance, a diffusion barrier sub-layer to prevent migration of atomic species into the N-type thermoelectric material, a eutectic bonding metal for low temperature attachment to another metal, and an oxidation barrier sub-layer such as Gold. The overall thickness of the magnetic metallization layer 120 is preferably in the range of and including 1.0 and 5.0 microns. Note that Cobalt is exemplary. Other types of magnetic materials having high electrical and thermal conductivity may be used.

The N-type thermoelectric material legs 86 are then placed on a substrate 122, and the first electrode assembly 88 is bonded to the first portion of the N-type thermoelectric material legs 86 as illustrated in FIG. 11H. The first electrode assembly 88 includes the AlN ceramic 90 and the Copper traces 92. At this point, a magnet 124 is placed under the substrate 122 opposite the N-type thermoelectric material legs 86 as also illustrated in FIG. 11H. As result of the mechanical force from lifting the first electrode assembly 88 and the magnetic force between the magnet 124 and the Cobalt, the N-type thermoelectric material legs 86 are broken apart to provide the first electrode assembly 88 having the first portion of the N-type thermoelectric material legs 86 bonded thereto, as illustrated in FIG. 11I. Note that the unharvested N-type thermoelectric material legs 86 (i.e., the N-type thermoelectric material legs 86 that are not bonded to the first electrode assembly 88) remained attached to the substrate 122. In this embodiment, the third electrode assembly 106 is bonded to the remaining portion of the N-type thermoelectric material legs 86 as illustrated in FIG. 11J. The third electrode assembly 106 includes the AlN ceramic 108 and the Copper traces 110. The third electrode assembly 106, including the N-type thermoelectric material legs 86, is then lifted from the substrate 76 as illustrated in FIG. 11K.

The process of FIGS. 11A through 11K is also performed for P-type thermoelectric material in order to form the P-type thermoelectric material legs 94 bonded to the second electrode assembly 96 and the fourth electrode assembly 112, as illustrated in FIGS. 11L and 11M, respectively. Lastly, the first electrode assembly 88 of FIG. 11I is bonded to the second electrode assembly 96 of FIG. 11L using a flip-chip bonding process as illustrated in FIG. 11N. At this point, fabrication of the thermoelectric module 70 is complete. In the same manner, the third electrode assembly 106 of FIG. 11K and the fourth electrode assembly 112 of FIG. 11M are bonded together using a flip-chip bonding process to fabricate the second thermoelectric module 118 as illustrated in FIG. 11O.

Those skilled in the art will recognize improvements and modifications to the preferred embodiments of the present disclosure. All such improvements and modifications are considered within the scope of the concepts disclosed herein and the claims that follow.

What is claimed is:

1. A method of fabrication of a thermoelectric module comprising:
   forming an N-type thin film thermoelectric material layer on a first substrate;
   forming a first metallization layer on the N-type thin film thermoelectric material layer;
   etching the first metallization layer and the N-type thin film thermoelectric material layer to form a plurality of N-type thermoelectric material legs;
   bonding a first electrode assembly to a first portion of the plurality of N-type thermoelectric material legs;
   removing the first electrode assembly including the first portion of the plurality of N-type thermoelectric material legs from the first substrate;

forming a P-type thin film thermoelectric material layer on a second substrate;

forming a second metallization layer over the P-type thin film thermoelectric material layer;

etching the second metallization layer and the P-type thin film thermoelectric material layer to form a plurality of P-type thermoelectric material legs;

bonding a second electrode assembly to a first portion of the plurality of P-type thermoelectric material legs;

removing the second electrode assembly including the first portion of the plurality of P-type thermoelectric material legs from the second substrate; and bonding the first electrode assembly including the first portion of the plurality of N-type thermoelectric material legs to the second electrode assembly including the first portion of the plurality of P-type thermoelectric material legs via a flip-chip bonding process to form a thermoelectric module comprising a plurality of thermoelectric devices connected in series.

2. The method of claim 1 wherein:

etching the first metallization layer and the N-type thin film thermoelectric material layer comprises etching the first metallization layer and the N-type thin film thermoelectric material layer completely through the N-type thin film thermoelectric material layer; and etching the second metallization layer and the P-type thin film thermoelectric material layer comprises etching the second metallization layer and the P-type thin film thermoelectric material layer completely through the P-type thin film thermoelectric material layer.

3. The method of claim 2 wherein:

removing the first electrode assembly including the first portion of the plurality of N-type thermoelectric material legs from the first substrate comprises dissolving a release layer situated between the first substrate and the N-type thin film thermoelectric material layer to thereby separate the first electrode assembly including the first portion of the plurality of N-type thermoelectric material legs bonded thereto from the first substrate; and removing the second electrode assembly including the first portion of the plurality of P-type thermoelectric material legs from the second substrate comprises dissolving a release layer situated between the second substrate and the P-type thin film thermoelectric material layer to thereby separate the second electrode assembly including the first portion of the plurality of P-type thermoelectric material legs bonded thereto from the second substrate.

4. The method of claim 2 wherein the first metallization layer is a first magnetic metallization layer comprising a magnetic material, and the second metallization layer is a second magnetic metallization layer comprising a magnetic material.

5. The method of claim 4 wherein:

etching the first metallization layer and the N-type thin film thermoelectric material layer comprises etching the first magnetic metallization layer and the N-type thin film thermoelectric material layer completely through the N-type thin film thermoelectric material layer; and etching the second metallization layer and the P-type thin film thermoelectric material layer comprises etching the second magnetic metallization layer and the P-type thin film thermoelectric material layer completely through the P-type thin film thermoelectric material layer.

6. The method of claim 5 wherein removing the first electrode assembly including the first portion of the plurality of N-type thermoelectric material legs from the first substrate comprises:

placing a magnet adjacent to a surface of the first substrate opposite the plurality of N-type thermoelectric material legs; and dissolving a release layer situated between the first substrate and the N-type thin film thermoelectric material layer to thereby separate the first electrode assembly including the first portion of the plurality of N-type thermoelectric material legs bonded thereto from the first substrate;

wherein a magnetic force between the magnet and magnetic material that remains from the first magnetic metallization layer maintains a remaining portion of the plurality of N-type thermoelectric material legs that are not bonded to the first electrode assembly on the first substrate.

7. The method of claim 6 wherein removing the second electrode assembly including the first portion of the plurality of P-type thermoelectric material legs from the second substrate comprises:

placing a magnet adjacent to a surface of the second substrate opposite the plurality of P-type thermoelectric material legs; and dissolving a release layer situated between the second substrate and the P-type thin film thermoelectric material layer to thereby separate the second electrode assembly including the first portion of the plurality of P-type thermoelectric material legs bonded thereto from the second substrate;

wherein a magnetic force between the magnet and magnetic material that remains from the second magnetic metallization layer maintains a remaining portion of the plurality of P-type thermoelectric material legs that are not bonded to the second electrode assembly on the second substrate.

8. The method of claim 7 further comprising:

bonding a third electrode assembly to the remaining portion of the plurality of N-type thermoelectric material legs;

bonding a fourth electrode assembly to the remaining portion of the plurality of P-type thermoelectric material legs; and bonding the third electrode assembly to the fourth electrode assembly via the flip-chip bonding process to form a second thermoelectric module comprising a plurality of thermoelectric devices connected in series.

9. The method of claim 1 wherein:

etching the first metallization layer and the N-type thin film thermoelectric material layer comprises etching the first metallization layer and the N-type thin film thermoelectric material layer to a predetermined thickness from a bottom of the N-type thin film thermoelectric material layer; and etching the second metallization layer and the P-type thin film thermoelectric material layer comprises etching the second metallization layer and the P-type thin film thermoelectric material layer to a predetermined thickness from a bottom of the P-type thin film thermoelectric material layer.

10. The method of claim 9 wherein removing the first electrode assembly including the first portion of the plurality of N-type thermoelectric material legs from the first substrate comprises:

dissolving a release layer positioned between the first substrate and the N-type thin film thermoelectric material layer to thereby remove the plurality of N-type thermoelectric material legs from the first substrate, the plurality of N-type thermoelectric material legs having a continuous bottom surface as a result of etching to the predetermined thickness from the bottom of the N-type thin film thermoelectric material layer;

forming a third metallization layer on the continuous bottom surface of the plurality of N-type thermoelectric material legs; and separating the plurality of N-type thermoelectric material legs.

11. The method of claim 10 wherein separating the plurality of N-type thermoelectric material legs comprises separating the plurality of N-type thermoelectric material legs by mechanical force.

12. The method of claim 10 wherein separating the plurality of N-type thermoelectric material legs comprises:

attaching the continuous bottom surface of the plurality of N-type thermoelectric material legs comprising the third metallization layer to a substrate; and after bonding the first electrode assembly to the first portion of the plurality of N-type thermoelectric material legs, lifting the first electrode assembly such that the first portion of the plurality of N-type thermoelectric material legs are separated from a remaining portion of the plurality of N-type thermoelectric material legs by mechanical force.

13. The method of claim 10 wherein the third metallization layer on the continuous bottom surface of the plurality of N-type thermoelectric material legs is a magnetic metallization layer that comprises a magnetic material, and separating the plurality of N-type thermoelectric material legs comprises:

placing the continuous bottom surface of the plurality of N-type thermoelectric material legs comprising the magnetic metallization layer on a substrate;

placing a magnet adjacent to a surface of the substrate opposite the plurality of N-type thermoelectric material legs; and after bonding the first electrode assembly to the first portion of the plurality of N-type thermoelectric material legs, lifting the first electrode assembly such that the first portion of the plurality of N-type thermoelectric material legs are separated from a remaining portion of the plurality of N-type thermoelectric material legs by mechanical force and the remaining portion of the plurality of N-type thermoelectric material legs are maintained on the substrate as a result of a magnetic force between the magnet and corresponding portions of the magnetic metallization layer on the continuous bottom surface of the plurality of N-type thermoelectric material legs.

14. The method of claim 10 wherein the third metallization layer on the continuous bottom surface of the plurality of N-type thermoelectric material legs comprises a Copper sublayer.

15. The method of claim 10 wherein removing the second electrode assembly including the first portion of the plurality of P-type thermoelectric material legs from the second substrate comprises:

dissolving a release layer positioned between the second substrate and the P-type thin film thermoelectric material layer to thereby remove the plurality of P-type thermoelectric material legs from the second substrate, the plurality of P-type thermoelectric material legs having a continuous bottom surface as a result of etching to the predetermined thickness from the bottom of the P-type thin film thermoelectric material layer;

forming a fourth metallization layer on the continuous bottom surface of the plurality of P-type thermoelectric material legs; and separating the plurality of P-type thermoelectric material legs.

16. The method of claim 15 wherein separating the plurality of P-type thermoelectric material legs comprises separating the plurality of P-type thermoelectric material legs by mechanical force.

17. The method of claim 15 wherein separating the plurality of P-type thermoelectric material legs comprises:

attaching the continuous bottom surface of the plurality of P-type thermoelectric material legs comprising the fourth metallization layer to a substrate; and after bonding the second electrode assembly to the first portion of the plurality of P-type thermoelectric material legs, lifting the second electrode assembly such that the first portion of the plurality of P-type thermoelectric material legs are separated from a remaining portion of the plurality of P-type thermoelectric material legs by mechanical force.

18. The method of claim 16 wherein the fourth metallization layer on the bottom surface of the plurality of P-type thermoelectric material legs is a magnetic metallization layer that comprises a magnetic material, and separating the plurality of P-type thermoelectric material legs comprises:

placing the continuous bottom surface of the plurality of P-type thermoelectric material legs comprising the magnetic metallization layer on a substrate;

placing a magnet adjacent a surface of the substrate opposite the plurality of P-type thermoelectric material legs; and after bonding the second electrode assembly to the first portion of the plurality of P-type thermoelectric material legs, lifting the second electrode assembly such that the first portion of the plurality of P-type thermoelectric material legs are separated from a remaining portion of the plurality of P-type thermoelectric material legs by mechanical force and the remaining portion of the plurality of P-type thermoelectric material legs are maintained on the substrate as a result of a magnetic force between the magnet and corresponding portions of the magnetic metallization layer formed on the continuous bottom surface of the plurality of P-type thermoelectric material legs.

19. The method of claim 15 wherein the fourth metallization layer on the continuous bottom surface of the plurality of P-type thermoelectric material legs comprises a Copper sublayer.

20. The method of claim 16 further comprising:

bonding a third electrode assembly to the remaining portion of the plurality of N-type thermoelectric material legs;

bonding a fourth electrode assembly to the remaining portion of the plurality of P-type thermoelectric material legs; and bonding the third electrode assembly to the fourth electrode assembly via the flip-chip bonding process to form a second thermoelectric module comprising a plurality of thermoelectric devices connected in series.

21. The method of claim 9 wherein the predetermined thickness from the bottom of the N-type thin film thermoelectric material layer is in a range of about 10% to 20% of a thickness of the N-type thin film thermoelectric material layer, and the predetermined thickness from the bottom of the P-type thin film thermoelectric material layer is in a range of about 10% to 20% of a thickness of the P-type thin film thermoelectric material layer.

* * * * *